US010128334B1

(12) United States Patent
Bourjot et al.

(10) Patent No.: US 10,128,334 B1
(45) Date of Patent: Nov. 13, 2018

(54) FIELD EFFECT TRANSISTOR HAVING AN AIR-GAP GATE SIDEWALL SPACER AND METHOD

(71) Applicant: GLOBALFOUNDRIES INC., Grand Cayman (KY)

(72) Inventors: Emilie Bourjot, Cohoes, NY (US); Ruilong Xie, Schenectady, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/672,336

(22) Filed: Aug. 9, 2017

(51) Int. Cl.
| | | |
|---|---|---|
| *H01L 29/00* | (2006.01) | |
| *H01L 29/06* | (2006.01) | |
| *H01L 29/49* | (2006.01) | |
| *H01L 29/423* | (2006.01) | |
| *H01L 29/72* | (2006.01) | |
| *H01L 29/66* | (2006.01) | |

(52) U.S. Cl.
CPC .... *H01L 29/0653* (2013.01); *H01L 29/42376* (2013.01); *H01L 29/4991* (2013.01); *H01L 29/6659* (2013.01); *H01L 29/66507* (2013.01); *H01L 29/72* (2013.01)

(58) Field of Classification Search
CPC H01L 21/7682; H01L 21/764; H01L 29/6653
See application file for complete search history.

(56) References Cited

U.S. PATENT DOCUMENTS

| | | | |
|---|---|---|---|
| 7,741,663 B2 | 6/2010 | Hause et al. | |
| 8,183,627 B2 | 5/2012 | Currie | |
| 8,952,452 B2 * | 2/2015 | Kang | H01L 29/78 257/346 |
| 9,190,486 B2 * | 11/2015 | Xie | H01L 29/66545 |
| 9,252,233 B2 | 2/2016 | Hsiao et al. | |
| 9,362,355 B1 * | 6/2016 | Cheng | H01L 29/66742 |
| 9,721,897 B1 * | 8/2017 | Cheng | H01L 23/535 |
| 2012/0129301 A1 | 5/2012 | Or-Bach et al. | |
| 2013/0248950 A1 * | 9/2013 | Kang | H01L 29/78 257/288 |

(Continued)

OTHER PUBLICATIONS

Benoit et al., "Interest of SiCo Low K=4.5 Spacer Deposited at Low Temperature (400°) in the Perspective of 3D VLSI Integration", IEEE, 2015, pp. 8.6.1-8.6.4.

*Primary Examiner* — William Harriston
(74) *Attorney, Agent, or Firm* — Gibb & Riley, LLC; Francois Pagette

(57) ABSTRACT

A method is disclosed wherein a gate, having a gate cap and a sacrificial gate sidewall spacer, is formed adjacent to channel region(s) of a transistor and metal plugs, having plug caps, are formed on source/drain regions. The sacrificial gate sidewall spacer is selectively etched, creating a cavity that exposes sidewalls of the gate and gate cap. Optionally, the sidewalls of the gate cap are etched back to widen the upper portion of the cavity. A dielectric spacer layer is deposited to form an air-gap gate sidewall spacer within the cavity. Since different materials are used for the plug caps, gate cap and dielectric spacer layer, a subsequently formed gate contact opening will be self-aligned to the gate. Thus, a gate contact can be formed over an active region (or close thereto) without risk of gate contact-to-metal plug shorting. A structure formed according to the method is also disclosed.

13 Claims, 20 Drawing Sheets

(56) References Cited

U.S. PATENT DOCUMENTS

| | | |
|---|---|---|
| 2013/0334587 A1 | 12/2013 | Purayath et al. |
| 2014/0077305 A1 | 3/2014 | Pethe et al. |
| 2015/0214113 A1 | 7/2015 | Bouche et al. |
| 2015/0243544 A1 | 8/2015 | Alptekin et al. |
| 2015/0372102 A1* | 12/2015 | Usami ............... H01L 29/41775 257/327 |
| 2016/0020148 A1* | 1/2016 | Song ................... H01L 23/535 438/238 |
| 2016/0111515 A1 | 4/2016 | Besser et al. |
| 2017/0323824 A1* | 11/2017 | Chang ................ H01L 21/7682 |
| 2017/0358673 A1* | 12/2017 | Cheng ................ H01L 21/0214 |

* cited by examiner

FIELD EFFECT TRANSISTOR HAVING AN AIR-GAP GATE SIDEWALL SPACER AND METHOD

BACKGROUND

Field of the Invention

The present invention relates to integrated circuit (IC) structures and, more particularly, to methods of forming IC structures with one or more field effect transistors having an air-gap gate sidewall spacer and, optionally, a gate contact (CB) over an active region (CBoA) or close thereto.

Description of Related Art

Recently, methods of forming integrated circuit (IC) structures have been developed to enable the formation of a field effect transistor (FET) with an air-gap gate sidewall spacer. By incorporating an air-gap gate sidewall spacer into the FET, parasitic capacitance and, particularly, the capacitance between the gate of the FET and adjacent metal plugs on the FET's source/drain regions is reduced as compared to a FET with a conventional gate sidewall spacer.

Methods of forming integrated circuit (IC) structures have also been developed to enable the formation of a FET with a gate contact over the active region (CBoA). By forming the gate contact over the active region, as opposed to outside the active region over an isolation region, the area required for the IC structure can be reduced (i.e., size scaling can occur). More specifically, middle of the line (MOL) contacts are contacts that connect field effect transistors (FETs) to the back end of the line (BEOL) metal levels. These MOL contacts include at least one gate contact (CB) and source/drain contacts (CAs). The gate contact extends vertically through the interlayer dielectric (ILD) material from a metal wire or via in the first BEOL metal level (referred to herein as the M0 level) to the gate of the FET. Each source/drain (S/D) contact extends vertically through the ILD material from a metal wire or via in the first BEOL metal level to a metal plug (TS), which is above and immediately adjacent to a source/drain region of the FET. Historically, each gate contact was formed outside the active region (i.e., so that it lands on the gate outside the active region) in order to avoid the occurrence of a short between the gate contact and either of the metal plugs on the S/D regions. New techniques have, however, been developed to enable the formation of MOL contacts, including a gate contact over the active region (CBoA), and also avoid the occurrence of shorts, including gate contact-to-metal plug shorts and S/D contact to gate shorts. Unfortunately, these new techniques are incompatible with the above-mentioned methods that were developed to form forming IC structures with FETs having air-gap gate sidewall spacers.

SUMMARY

In view of the foregoing, disclosed herein are embodiments of a method of forming an integrated circuit (IC) structure having one or more transistors, each with an air-gap gate sidewall spacer and, optionally, a gate contact over an active region (i.e., a CBoA) or close thereto.

Generally, the disclosed method embodiments include forming at least one transistor. The transistor can include source/drain regions and one or more channel regions positioned laterally between the source/drain regions. This transistor can also include a gate adjacent to the channel region(s). A gate cap can be on the top surface of the gate and the gate and gate cap can have essentially vertically aligned sidewalls. A sacrificial gate sidewall spacer can be positioned laterally adjacent to the sidewalls of the gate and gate cap. This transistor can also include metal plugs on the source/drain regions and the metal plugs can have plug caps. Thus, the sacrificial gate sidewall spacer will be positioned laterally between the metal plugs and the gate and also between the plug caps and the gate cap. Subsequently, the sacrificial gate sidewall spacer can be selectively etched in order to create a cavity that exposes sidewalls of the gate and the gate cap. After the cavity is formed, air-gap gate sidewall spacer can be formed in the cavity. Specifically, a dielectric spacer layer can be deposited such that it pinches off before filling the cavity completely. Thus, the resulting sidewall spacer includes a first segment (i.e., a lower segment) within a first portion (i.e., a lower portion) of the cavity adjacent to the gate (including between the gate and the metal plugs) and a second segment (i.e., an upper segment) within a second portion (i.e., an upper portion) of the cavity adjacent to the gate cap (including between the plug caps and the gate cap). The first segment can include an air-gap and, optionally, any of the dielectric spacer material that enters the first portion of the cavity prior to pinching off. The second segment can include the dielectric spacer layer, which completely fills the second portion of the cavity.

One exemplary method embodiment includes narrowing the gate cap prior to forming the air-gap gate sidewall spacer to ensure that the air-gap in the resulting air-gap gate sidewall spacer is contained within the first portion (i.e., the lower portion) of the cavity adjacent to the gate. Specifically, this method embodiment includes forming at least one transistor. The transistor can include source/drain regions and one or more channel regions positioned laterally between the source/drain regions. This transistor can also include a gate adjacent to the channel region(s). A gate cap can be on the top surface of the gate and the gate and gate cap can have essentially vertically aligned sidewalls. A sacrificial gate sidewall spacer can be positioned laterally adjacent to the sidewalls of the gate and gate cap. This transistor can also include metal plugs on the source/drain regions and the metal plugs can have plug caps. Thus, the sacrificial gate sidewall spacer will be positioned laterally between the metal plugs and the gate and also between the plug caps and the gate cap. Subsequently, the sacrificial gate sidewall spacer can be selectively etched in order to create a cavity that exposes sidewalls of the gate and the gate cap. Next, exposed sidewalls of the gate cap can be selectively etched back (e.g., using a selective isotropic etch process) such that a first portion (i.e., a lower portion) of the cavity adjacent to the gate has a first width and such that a second portion (i.e., an upper portion) of the cavity adjacent to the gate cap has a second width that is greater than the first width. Then, an air-gap gate sidewall spacer can be formed in the cavity. Specifically, a dielectric spacer layer can be deposited such that it pinches off before filling the relatively narrow first portion (i.e., the lower portion) of the cavity. Thus, the resulting sidewall spacer includes a first segment (i.e., a lower segment) within the first portion of the cavity adjacent to the gate (including between the gate and the metal plugs) and a second segment (i.e., an upper segment) within the second portion of the cavity adjacent to the gate cap (including between the plug caps and the gate cap). The first segment will have the first width and will include an air-gap and, optionally, any of the dielectric spacer material that enters the first portion of the cavity prior to pinching off.

The second segment will have the second width and will include the dielectric spacer layer, which completely fills the second portion of the cavity.

Also disclosed herein are embodiments of an integrated circuit (IC) structure formed according to the above-described method. The IC structure can have one or more transistors, each with an air-gap gate sidewall spacer and, optionally, a gate contact over an active region (i.e., a CBoA) or close thereto. Each transistor can include source/drain regions and one or more channel regions positioned laterally between the source/drain regions. Each transistor can also include a gate adjacent to the channel region(s), a gate cap on the top surface of the gate and a gate contact that extends through the gate cap to the top surface of the gate. Each transistor can also include an air-gap gate sidewall spacer. The air-gap gate sidewall spacer can include a first segment (i.e., a lower segment) and a second segment (i.e., an upper segment). The first segment can be positioned laterally immediately adjacent to the gate (including between the gate and the metal plugs). The first segment can have a first width and can include an air-gap and, optionally, some dielectric spacer material. The second segment can be above the first segment and can further extend laterally onto the top surface of the gate so as to cover the upper corners of the gate. Thus, the second segment can have a second width that is greater than the first width. The second segment can be positioned laterally immediately adjacent to the gate cap and, optionally, the gate contact that extends through the gate cap to the top surface of the gate. The second segment can include a dielectric spacer layer, which pinched-off during deposition so as to trap the air-gap within the first segment below.

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
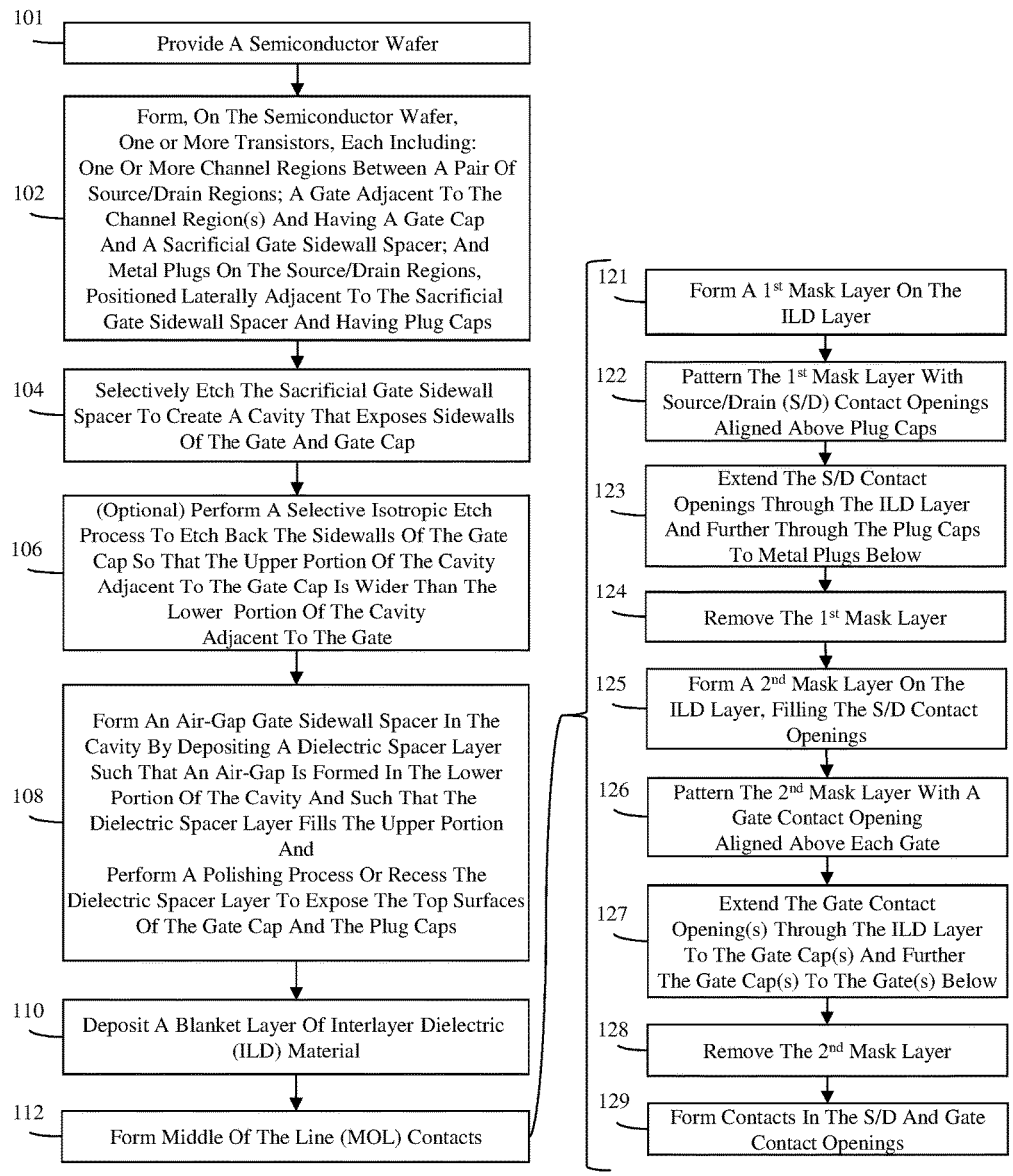
FIG. 1 is a flow diagram illustrating embodiments of a method of forming an integrated circuit (IC) structure.

As mentioned above, recently, methods of forming integrated circuit (IC) structures have been developed to enable the formation of a field effect transistor (FET) with an air-gap gate sidewall spacer. By incorporating an air-gap gate sidewall spacer into the FET, parasitic capacitance and, particularly, the capacitance between the gate of the FET and adjacent metal plugs on the FET's source/drain regions is reduced as compared to a FET with a conventional gate sidewall spacer.

Methods of forming integrated circuit (IC) structures have also been developed to enable the formation of a FET with a gate contact over the active region (CBoA). By forming the gate contact over the active region, as opposed to outside the active region over an isolation region, the area required for the IC structure can be reduced (i.e., size scaling can occur). More specifically, middle of the line (MOL) contacts are contacts that connect field effect transistors (FETs) to the back end of the line (BEOL) metal levels. These MOL contacts include at least one gate contact (CB) and source/drain contacts (CAs). The gate contact extends vertically through the interlayer dielectric (ILD) material from a metal wire or via in the first BEOL metal level (referred to herein as the M0 level) to the gate of the FET. Each source/drain (S/D) contact extends vertically through the ILD material from a metal wire or via in the first BEOL metal level to a metal plug (TS), which is above and immediately adjacent to a source/drain region of the FET. Historically, each gate contact was formed outside the active region (i.e., so that it lands on the gate outside the active region) in order to avoid the occurrence of a short between the gate contact and either of the metal plugs on the S/D regions. New techniques have, however, been developed to enable the formation of MOL contacts, including a gate contact over the active region (CBoA), and also avoid the occurrence of shorts, including gate contact-to-metal plug shorts and S/D contact to gate shorts. Unfortunately, these new techniques are incompatible with the above-mentioned methods that were developed to form forming IC structures with FETs having air-gap gate sidewall spacers.

In view of the foregoing, disclosed herein are embodiments of a method of forming an integrated circuit (IC) structure having one or more transistors, each with an air-gap gate sidewall spacer and, optionally, a gate contact over an active region (a CBoA) or close thereto. In the method embodiments, a gate, having a gate cap and a sacrificial gate sidewall spacer, can be formed adjacent to the channel region(s) of a transistor and metal plugs, having plug caps, can be formed on source/drain regions. The sacrificial gate sidewall spacer can be selectively etched, thereby creating a cavity that exposes sidewalls of the gate and gate cap. Optionally, a selective isotropic etch process can be performed in order to etch back the sidewalls of the gate cap such that the upper portion of the cavity adjacent to the gate cap is wider than the lower portion of the cavity adjacent to the gate. A dielectric spacer layer can then be deposited, forming an air-gap gate sidewall spacer in the cavity. During middle of the line (MOL) processing, when a gate contact opening is formed through interlayer dielectric (ILD) material and the gate cap to the gate, the gate contact opening will be self-aligned to the gate due to different materials used for the plug caps, gate cap and dielectric spacer layer. Thus, the gate contact can be formed over an active region (or close thereto) without risk of shorting to an adjacent metal plug. Also disclosed herein are the resulting IC structures formed according to the method embodiments.

More particularly, referring to the flow diagram of FIG. 1, generally in the methods disclosed herein a semiconductor wafer is provided (101). The semiconductor wafer provided at process 101 can be, for example, a semiconductor-on-insulator wafer (e.g., a silicon-on-insulator (SOI)) wafer that includes a semiconductor substrate 204 (e.g., a silicon substrate), an insulator layer 205 (e.g., a buried oxide (BOX) layer or other suitable insulator layer on the semiconductor substrate) and a semiconductor layer (e.g., a silicon layer or other suitable semiconductor layer) on the insulator layer 205. Alternatively, a bulk semiconductor wafer (e.g., a bulk silicon wafer or other suitable bulk semiconductor wafer) could be used.

Figure 2A:
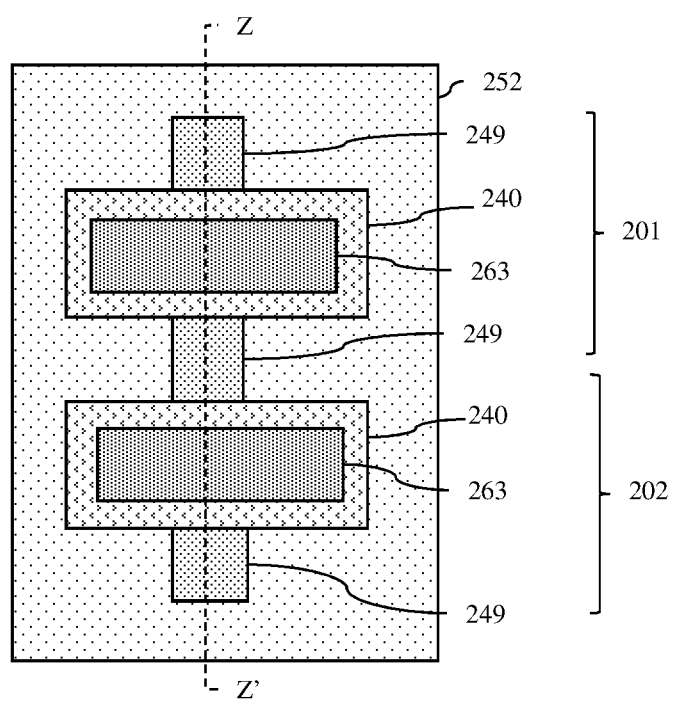
FIG. 2A is a top view diagram illustrating a partially completed structure formed according to the flow diagram of FIG. 1.
Figure 2B:
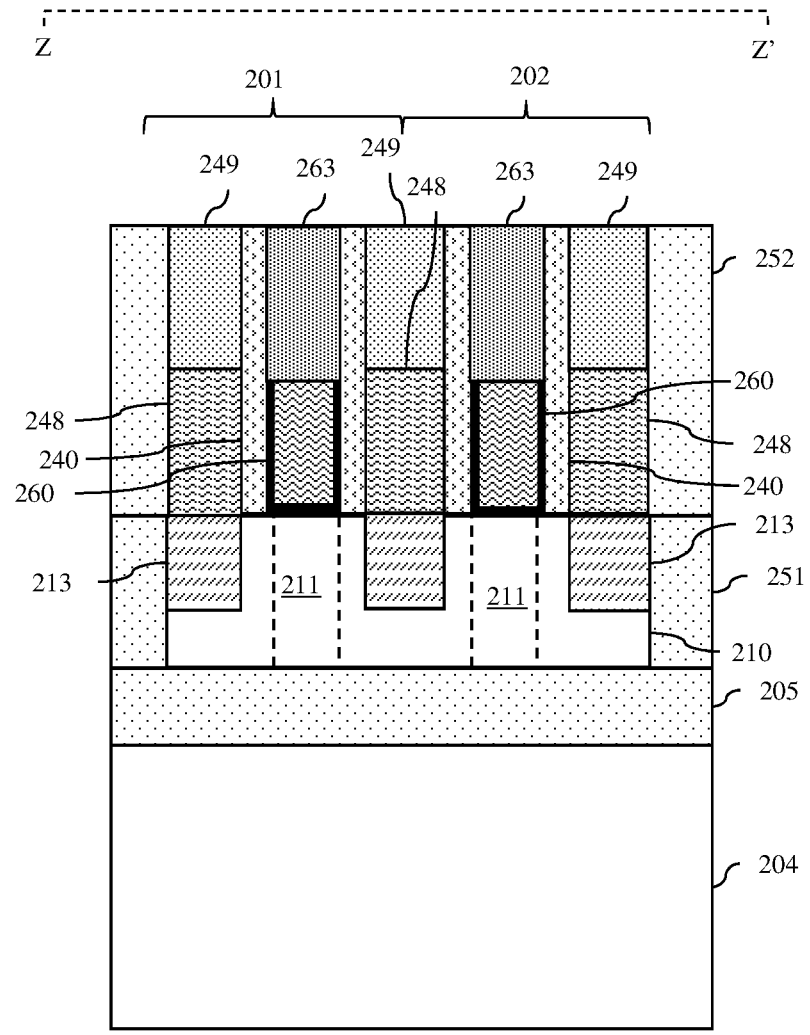
FIG. 2B is a cross section diagram illustrating an embodiment of the partially completed structure of FIG. 2A.
Figure 2C:
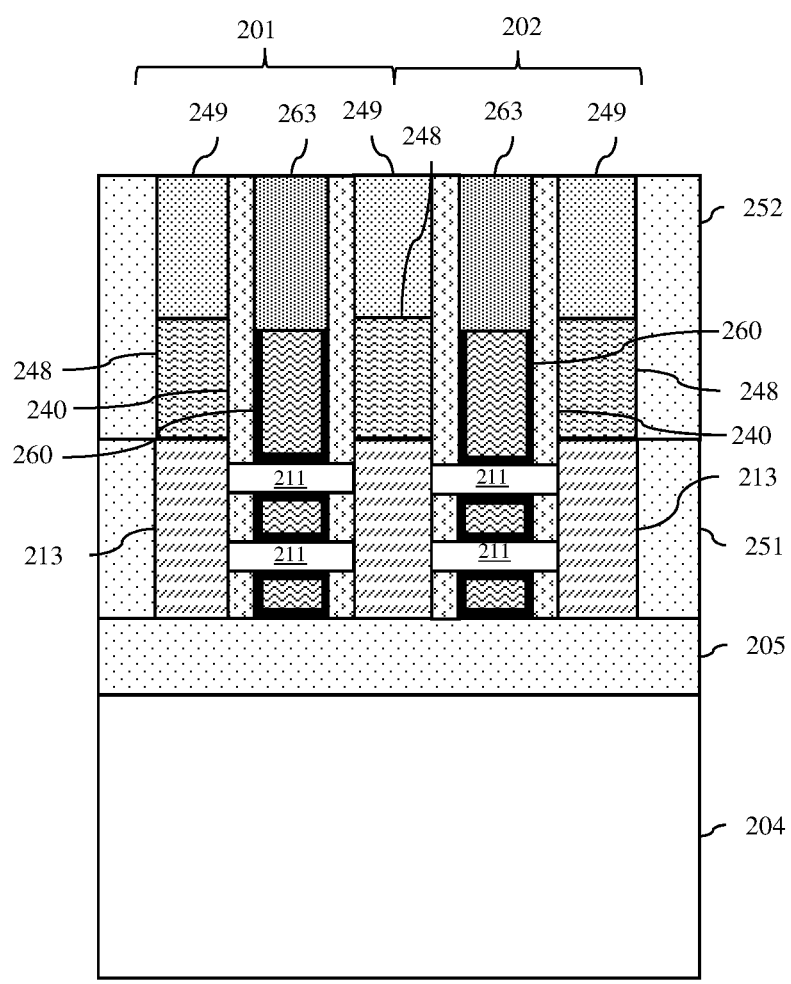
FIG. 2C is a cross section diagram illustrating an alternative embodiment of the partially completed structure.

An initial structure, which include one or more field effect transistors (FETs) laterally surrounded by one or more layers (e.g., see layers 251-252) of interlayer dielectric (ILD) material, can be formed on the semiconductor wafer during front end of the line (FEOL) processing (see process 102). FIG. 2A is a top view diagram of an exemplary initial structure formed at process 102, which includes two non-planar FETs 201-202 that share a source/drain region. FIG. 2B is a cross-section diagram illustrating one embodiment wherein the two non-planar FETs 201-202 formed at process 102 are fin-type FETs (FINFETs). FIG. 2C is a cross-section diagram illustrating another embodiment wherein the two non-planar FETs 201-202 formed at process 102 are nanowire (NW)-type FETs (NWFETs). Alternatively, the FET(s) in the initial structure formed at process 102 could be planar FETs.

Those skilled in the art will recognize that a FINFET (e.g., such as any one of the FINFETs shown in FIG. 2B) is a non-planar FET that incorporates a semiconductor fin 210 (i.e., a relatively tall and thin, elongated, rectangular-shaped, semiconductor body) and, within the semiconductor fin 210, a channel region 211 positioned laterally between source/drain regions 213. A gate 260, which includes a conformal gate dielectric layer and a gate conductor layer on the gate dielectric layer, is positioned adjacent to the top surface and opposing sidewalls of the semiconductor fin 210 at the channel region 211. Such a FINFET exhibits two-dimensional field effects as compared to the single-dimensional field effects exhibited by a planar FET and, thus, exhibits improved gate control over the channel region. It should be noted that, because the semiconductor fin is so thin, any field effects exhibited at the top surface are insignificant (i.e., negligible).

Those skilled in the art will also recognize that a NWFET (e.g., such as any one of the NWFETs shown in FIG. 2C), like a FINFET, is also a non-planar FET that is formed using a semiconductor fin. However, in this case, the semiconductor fin has multiple stacked layers including at least one sacrificial layer. A portion of the multi-layer semiconductor fin, which is positioned laterally between the source/drain regions, is processed to remove the sacrificial layer(s), thereby forming one or more nanowires (NWs) that extend laterally between the source/drain regions 213. In the case of multiple NWs, are physical separated from each other, parallel to each other, and stacked one above the other. A gate 260 (e.g., a gate-all-around gate structure), which includes a conformal gate dielectric layer and a gate conductor layer, wraps around each of the NW(s) such that the NW(s) function as channel region(s) 211. Such a NWFET exhibits multi-dimensional field effects as compared to the two dimensional field effects exhibited by FINFET and, thus, exhibits improved gate control over the channel region (s).

Techniques for forming structures that include such FETs are well known in the art and, thus, the details of those techniques have been omitted from the specification in order to allow the reader to focus on the salient aspects of the disclosed method embodiments.

Thus, each FET 201-202 formed at process 102 can include source/drain regions 213 and one or more channel regions 211 positioned laterally between the source/drain regions 213. In the exemplary initial structures shown in FIGS. 2B and 2C, the two FETs 201-202 are positioned laterally adjacent to each other and have a shared source/drain region between them. The FETs 201-202 can, for example, be P-type FETs (PFETs), wherein the source/drain regions 213 are doped so as to have P-type conductivity at a relatively high conductivity level (e.g., P+ conductivity) and the channel region(s) 211 are either undoped or doped so as to have N-type conductivity at a relatively low conductivity level (e.g., N− conductivity). Alternatively, the FETs 201-202 can be N-type FETs (NFETs), wherein the source/drain regions 213 are doped so as to have N-type conductivity at a relatively high conductivity level (e.g., N+ conductivity) and the channel region(s) 211 are either undoped or doped so as to have P-type conductivity at a relatively low conductivity level (e.g., P− conductivity).

Those skilled in the art will recognize that different dopants can be used to achieve the different conductivity types and that the dopants may vary depending upon the different semiconductor materials used. For example, a silicon-based semiconductor material having N-type conductivity is typically doped with a Group V dopant, such as arsenic (As), phosphorous (P) or antimony (Sb), whereas a silicon-based semiconductor material having P-type conductivity is typically doped with a Group III dopant, such as boron (B) or indium (In). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Each FET 201-202 can further include a gate 260 adjacent to the channel region(s) 211. The gate 260 can have a top surface, a gate cap 263 on the top surface, sidewalls and a gate sidewall spacer 240 adjacent to the sidewalls. As mentioned above, in the case of FINFETs, the gate 260 of the FET 201 or 202 can be positioned adjacent to the top surface and opposing sidewalls of a semiconductor fin at the channel region 211 (see FIG. 2B). However, in the case of NWFETs, the gate 260 of the FET 201 or 202 will be a gate-all-around gate structure that wraps around each of the NW channel region(s) 211.

The gate 260 can be a gate-first gate structure that includes a conformal gate dielectric layer (e.g., a silicon dioxide layer) and a gate conductor layer (e.g., a polysilicon gate conductor layer) on the gate dielectric layer. Those skilled in the art will recognize that, for a PFET, the polysilicon gate conductor layer will typically be doped so as to have P-type conductivity; whereas for an NFET, the polysilicon gate conductor layer will typically be doped so as to have N-type conductivity.

Alternatively, the gate 260 can be a replacement metal gate (RMG). A RMG can include a conformal gate dielectric layer and a metal gate conductor layer on the gate dielectric layer. The materials and thicknesses of these layers can be preselected to achieve desired work functions given the conductivity type of the FET. The conformal gate dielectric layer can be a high-K dielectric material or, more particularly, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The metal gate conductor layer can include, for example, a work function metal layer and conductive fill material on the work function metal layer. The work function metal layer can be a layer of a metal material or a metal alloy material that is preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material can be an additional layer of a metal or a metal alloy, such as tungsten, a tungsten alloy (e.g., tungsten silicide or titanium tungsten), cobalt, aluminum or any other suitable metal or metal alloy.

The gate cap 263 can be on the top surface of the gate 260 and, in this initial structure, the gate 260 and the gate cap 263 can have essentially vertically aligned sidewalls. The material of the gate cap 263 (i.e., the gate cap material) can be a dielectric such as silicon nitride (SiN), silicon oxycarbonitiride (SiOCN), silicon boron carbonitride (SiBCN), or any other suitable dielectric material. Alternatively, this gate cap can be a sacrificial gate cap and the gate cap material can be, for example, amorphous silicon (a-Si), amorphous carbon (a-C) or any suitable removable sacrificial material.

The gate sidewall spacer 240 can be positioned immediately adjacent to and can laterally surround the vertically aligned sidewalls of the gate 260 and the gate cap 263. As discussed in greater detail below, during subsequent processing, all or the majority of this gate sidewall spacer 240 will be etched away such that, in the disclosed method embodiments, this gate sidewall spacer 240 is referred to as a sacrificial gate sidewall spacer 240. The material of the sacrificial gate sidewall spacer 240 (i.e., the sacrificial gate sidewall spacer) can be different from the material of the gate cap 263. For example, if the gate cap material is silicon oxycarbonitiride (SiOCN), silicon boron carbonitride (SiBCN), or amorphous silicon (a-Si), the sacrificial gate sidewall spacer material could be silicon nitride (SiN). If the gate cap material is silicon nitride (SiN), the sacrificial gate sidewall spacer material could be silicon boron carbonitride (SiBCN), etc.

Each FET 201-202 can further include the metal plugs 248 on the source/drain regions 213 and plug caps 249 on the metal plugs 248 such that, as illustrated, lower portions of the sacrificial gate sidewall spacer 240 on opposing sides of the gate 260 are positioned laterally between the metal plugs 248 and the gate 260 and upper portions of the sacrificial gate sidewall spacer 240 on opposing sides of the gate cap 263 (i.e., above the lower portions) are positioned laterally between the plug caps 249 and the gate cap 263. More specifically, the metal plugs 248 can be above and in contact with the top surfaces of the source/drain regions 213 (e.g., in the lower portions of metal plugs openings that extend essentially vertically through the layer 251 of ILD material above the source/drain regions 213 and that are positioned laterally adjacent to the sacrificial gate sidewall spacer 240). The metal plugs 248 can be made of a metal or metal alloy (e.g., a tungsten, cobalt, aluminum or any other suitable metal plug material). Plug caps 249 can be above and in contact with the top surfaces of the metal plugs 248 (e.g., in the upper portions of the metal plug openings). The material of the plug caps 249 (i.e., the plug cap material) can be different from both the material of the gate cap 263 and the material of the sacrificial gate sidewall spacer 240. For example, the plug cap material can be an oxide material, such as hafnium oxide or silicon dioxide, or any other suitable dielectric material.

It should be noted that the ILD material (e.g., of the layers 251 and 252) can be yet another material and, particularly, a dielectric material that is also different from the gate cap material, the sacrificial gate sidewall spacer material, and the plug cap material. The ILD material can be, for example, silicon dioxide, borophosphosilicate glass (BPSG), tetraethyl orthosilicate (TEOS), fluorinated tetraethyl orthosilicate (FTEOS), or any other suitable ILD material. Thus, for example, if the ILD material is silicon dioxide, the plug cap material can be hafnium oxide.

Additionally, it should be noted that, the initial structure formed at process 102 will have an essentially planar top surface at which top surface of the layer 252 of ILD material as well as top surfaces of the plug caps 249, the sacrificial gate sidewall spacer 240 and the gate cap 263 of each FET 201-202 are exposed.

For purposes of illustration, the remaining process steps in the method are described below and illustrated in the figures with respect to the initial structure shown in FIG. 2B that includes FINFET(s). However, it should be understood that the figures are not intended to be limiting and that, alternatively, the remaining process steps could be performed with respect to the initial structure shown in FIG. 2C (e.g., that includes NWFET(s)) or to any other initial structure formed so as have one or more FETs (e.g., planar FET(s)) formed to have components, as described above.

Figure 3A:
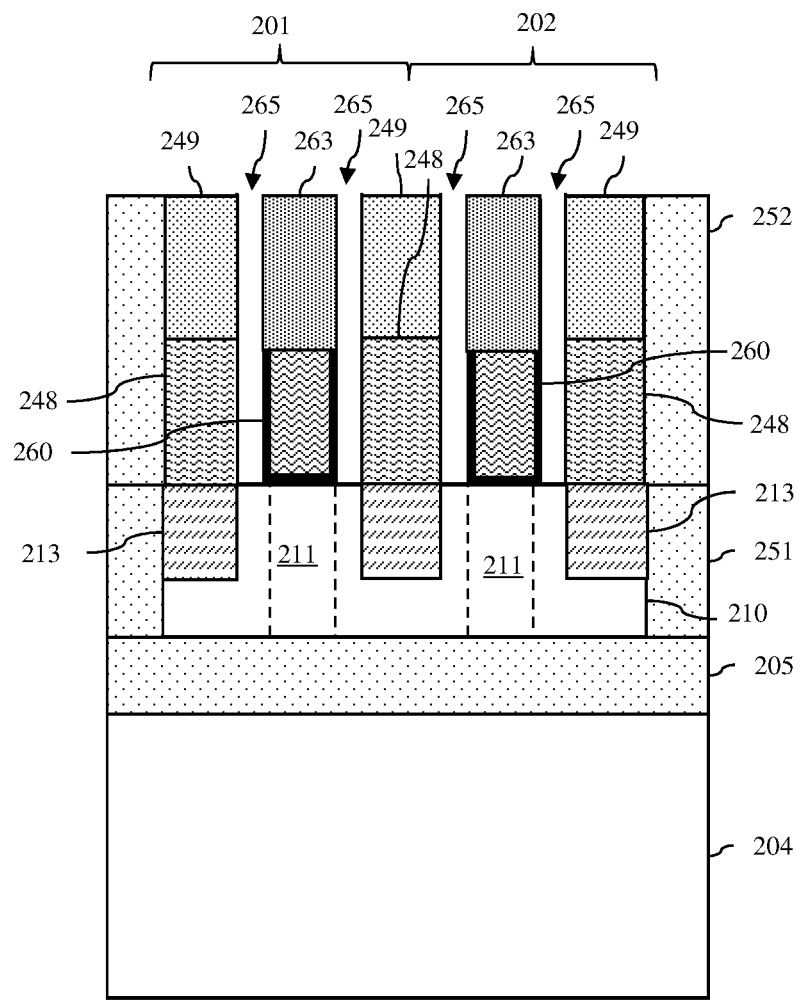
FIG. 3A is a cross section diagram illustrating an embodiment of a partially completed structure formed according to the flow diagram of FIG. 1.
Figure 3B:
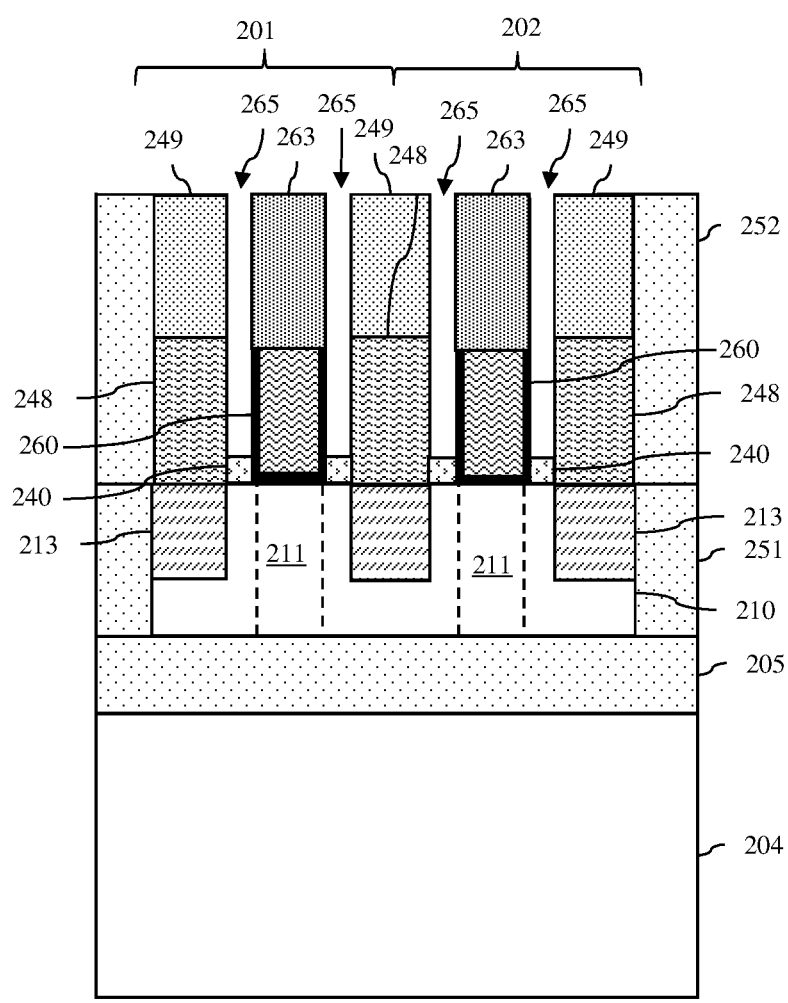
FIG. 3B is a cross section diagram illustrating an alternative embodiment of the partially completed structure.

Following formation of the initial structure at process 102, the sacrificial gate sidewall spacer 240 of each FET 201-202 can be selectively etched in order to create a corresponding cavity 265 that exposes the vertically aligned sidewalls of the gate 260 and the gate cap 263 (see process 104 and FIG. 3A or 3B). This selective etch process can be, for example, a selective reactive ion etch process that selectively etches material of the sacrificial gate sidewall spacer 240 over the material of the gate cap 263, the material of the plug caps 249 and further over the material (i.e., the ILD material) of the layer 252. Alternatively, this selective etch process can be any other suitable etch process that can be used to selectively etch the material of the sacrificial gate sidewall spacer 240 over the material of the gate cap 263, the material of the plug caps 249 and further over the material (i.e., the ILD material) of the layer 252. For example, if the gate cap material is silicon boron carbonitride (SiBCN), the sacrificial gate sidewall spacer material is silicon nitride (SiN), the plug cap material is hafnium oxide and the ILD material is silicon dioxide, then the silicon nitride sacrificial gate sidewall spacer material can be selectively etched using, for example, a hot phosphoric acid wet chemical etch process.

It should be noted that this selective etch process can be performed to remove the sacrificial gate sidewall spacer 240 in its entirety, as shown in FIG. 3A. Alternatively, this selective etch process can be timed to stop prior to complete removal of the sacrificial gate sidewall spacer 240, as shown in FIG. 3B. For example, this selective etch process can be timed to stop following formation of a cavity 265 that exposures of at least an upper ½, upper ⅔, upper ¾, etc. of the sidewalls of the gate 260 without exposing any of the semiconductor material of the channel region(s) 211 below and, thus, such that a segment of the sacrificial gate sidewall spacer 240 remains positioned laterally immediately adjacent to the gate 260.

For purposes of this disclosure, a selective etch process refers to an etch processes wherein one material is selectively etched and, more particularly, etched at a significantly faster rate than one or more other materials so as to remove all or portions that one material without significantly impacting the other material(s).

Figure 4:
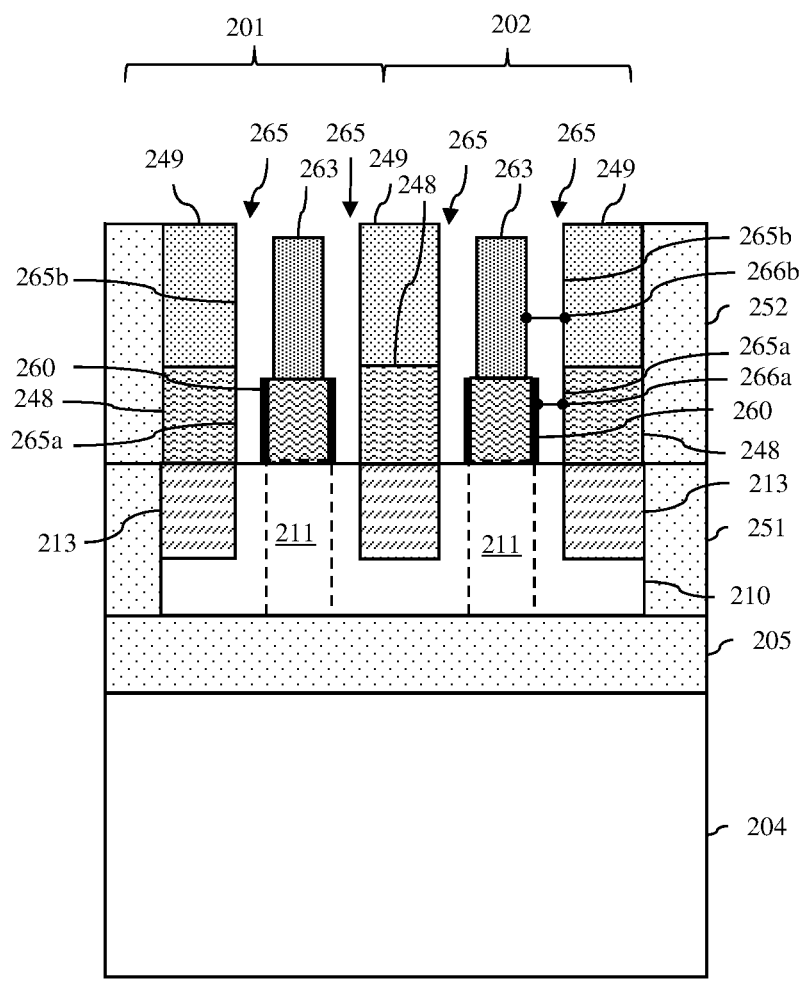
FIG. 4 is a cross section diagram illustrating a partially completed structure formed according to the flow diagram of FIG. 1.

Optionally, and preferably, exposed sidewalls of the gate cap 263 of each FET 201-202 can be selectively etched back (e.g., using a selective isotropic etch process) such that, in each FET 201-202, a first portion 265a (i.e., a lower portion) of the cavity 265 adjacent to the gate 260 has a first width 266a and such that a second portion 265b (i.e., an upper portion) of the cavity 265 adjacent to the gate cap 263 has a second width 266b that is greater than the first width 266a (see process 106 and FIG. 4). For example, if the gate cap material is silicon nitride, the silicon nitride gate cap 263 can be selectively and isotropically etched using, for example, a hot phosphoric acid wet chemical etch process, which is timed so as to stop prior to removal of the entire gate cap 263. It should, however, be understood that the specifications for the selective isotropic etch process will vary depending upon the material of the gate cap 263. That is, if the material of the gate cap 260 is some other material (e.g., silicon oxycarbonitiride (SiOCN), silicon boron carbonitride (SiBCN), amorphous silicon (a-Si), etc.), some other suitable selective isotropic etch process would be used to etch back the sidewalls of the gate cap 263. In any case, following a selective isotropic etch perform at process 106, the gate cap 263 will be narrower than the gate 260 below and the top surface of the gate cap 263 will be below the level of the top surfaces of the plug caps 249 and layer 252 of ILD material, as illustrated in FIG. 4. As discussed below, widening the second portion 265b (i.e., the upper portion) of the cavity 265 will help to ensure that an air-gap in an air-gap gate sidewall spacer 270 that is subsequently formed within the cavity 265 will be contained within the first portion 265a of the cavity 265 (i.e., positioned laterally adjacent to the gate 260 but not the gate cap 263).

Figure 5A:
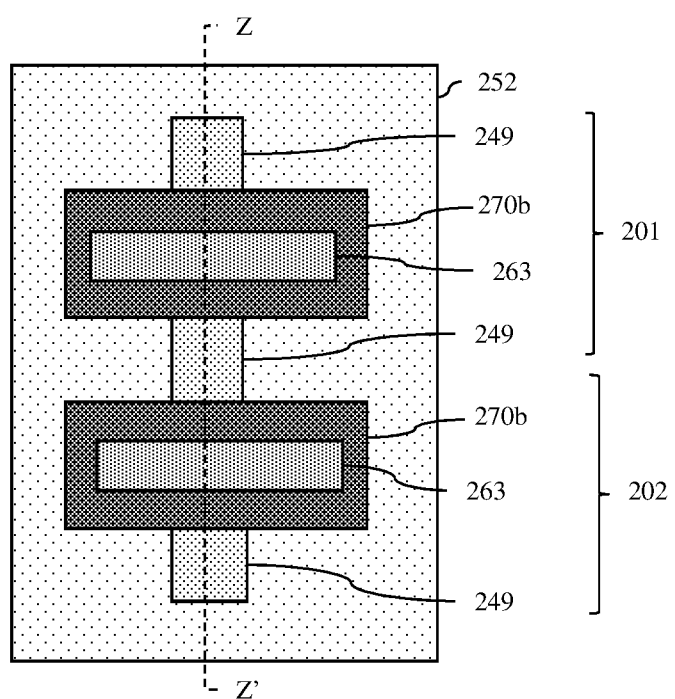
FIG. 5A is a top view diagram illustrating a partially completed structure formed according to the flow diagram of FIG. 1.
Figure 5B:
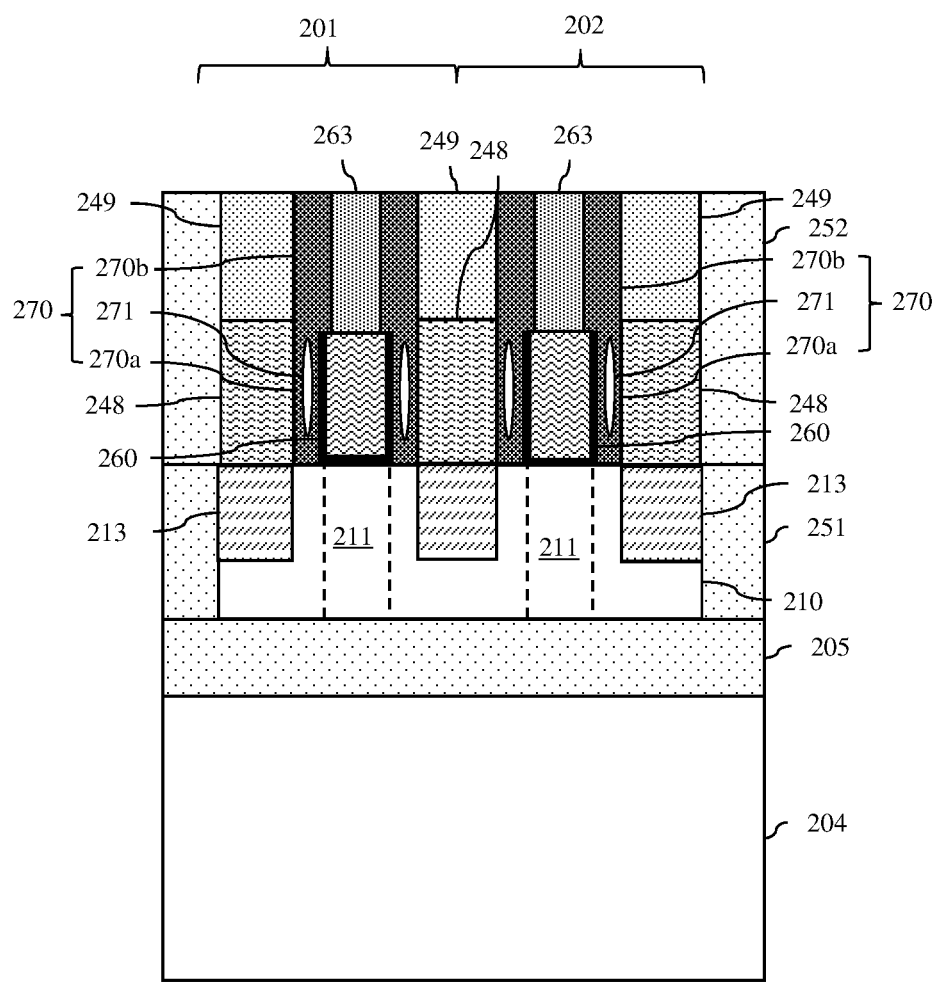
FIG. 5B is a cross section diagram illustrating an embodiment of the partially completed structure of FIG. 5A.
Figure 5C:
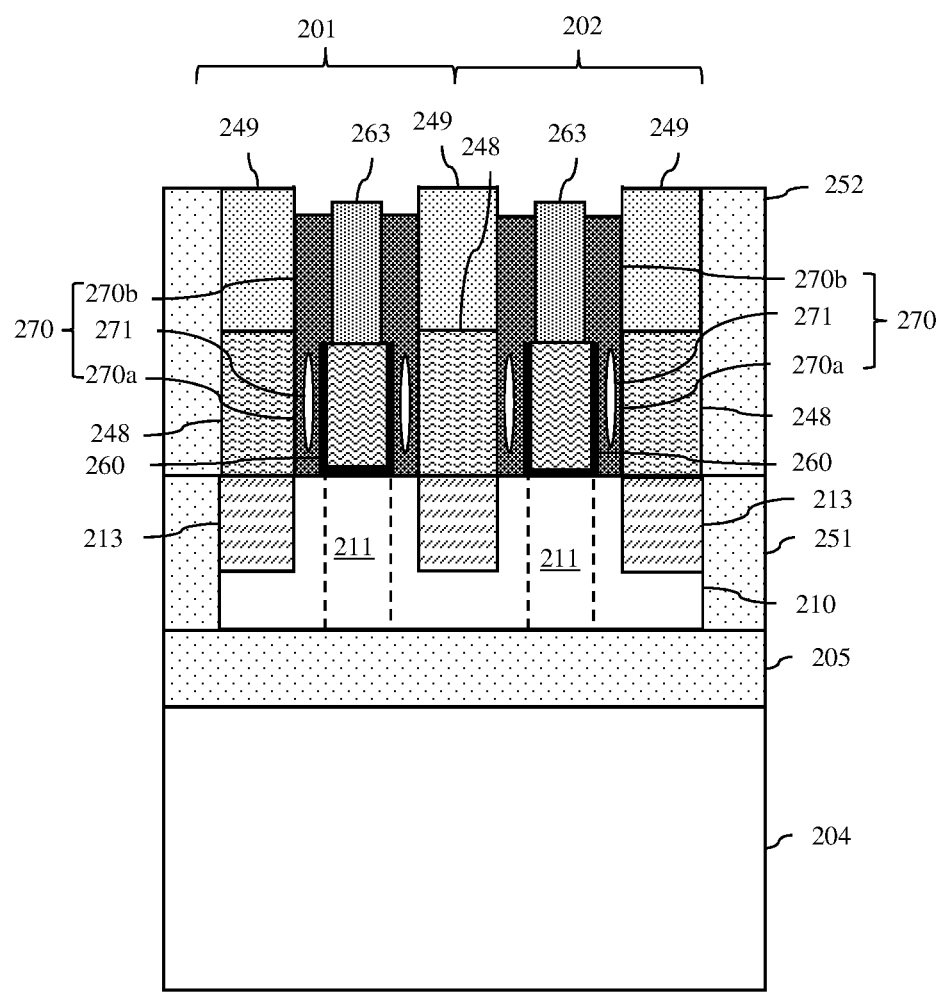
FIG. 5C is a cross section diagram illustrating an alternative embodiment of the partially completed structure.

An air-gap gate sidewall spacer 270 can then be formed in each cavity 265 that laterally surrounds a gate 260 and gate cap 263 thereon of each FET 201-202 (see process 108 and the top view diagram of FIG. 5A and the cross-section diagram of FIG. 5B or, alternatively, FIG. 5C). Specifically, a dielectric spacer layer can be deposited in such a way that, within each cavity 265, it pinches off, thereby creating an air-gap gate sidewall spacer 270 with an air-gap 271 (also referred to herein as a void) covered by dielectric spacer material. For example, a conformal dielectric spacer layer can be deposited and, depending upon the aspect ratio of the cavity 265 and a preselected thickness of the dielectric spacer layer, the location of the pinching off of the dielectric spacer layer can be controlled so that the air-gap 271 is contained within a first portion 265a (i.e., a lower portion) of the cavity 265 adjacent to the gate 260 and so that a second portion 265b (i.e., an upper portion) of the cavity 265 adjacent to the gate cap 263 is filled with the dielectric spacer layer. To better ensure that the air-gap 271 is contained within the first portion 265a (i.e., the lower portion) of the cavity 265, the second portion 265b (i.e., the upper portion) of the cavity 265 can first be widened at process 106, as discussed above. Specifically, in this case, a relatively thick conformal dielectric spacer layer is deposited and, although some of the dielectric spacer material may enter the narrow first portion 265a of the cavity, the different widths of the first and second portions of the cavity 265 as well as the thickness of the conformal dielectric spacer layer ensure that the dielectric spacer layer will pinch off at the opening to the first portion 265a of the cavity 265 near the level of the top surface of the gate 260, thereby plugging up the opening before completely filling that first portion 265a of the cavity 265 adjacent to the gate 260. Thus, an air-gap 271 (also referred to a void) will be trapped within that first portion 265a of the cavity 265.

In either case, the resulting air-gap gate sidewall spacer 270 will include a first segment 270a (i.e., a lower segment) within the first portion 265a (i.e., a lower portion) of the cavity 265 adjacent to the gate 260 (including between the gate 260 and the metal plugs 248) and a second segment 270b (i.e., an upper segment) within a second portion 265b (i.e., an upper portion) of the cavity 265 adjacent to the gate cap 263 (including between the plug caps 249 and the gate cap 263). The first segment 270a can include an air-gap 271 and, optionally, any of the dielectric spacer material that enters the first portion 265a of the cavity 265 prior to pinching off. The second segment 270b can include the dielectric spacer layer, which completely fills the second portion 265b of the cavity 265. If, as discussed above at process 106, the sidewalls of the gate cap 263 are etched back such that the first portion 265a of the cavity 265 has the first width 266a and the second portion 265b of the cavity 265 has the second width 266b that is wider than the first portion 265a, then the first segment 270a will similarly have the first width 266a and the second segment 270b will have the second width 266b. Thus, the second segment 270b will extend laterally onto the top surface of the gate 260 so as to cover the upper corners of the gate 260.

As illustrated in FIGS. 5B and 5C, the first segment 270a of the air-gap gate sidewall spacer 270 can be above and immediately adjacent to semiconductor material below. However, alternatively, if the sacrificial gate sidewall spacer 240 was not completely removed at process 104, as discussed above and illustrated in FIG. 3B, the air-gap gate sidewall spacer 270 will include an additional segment and, particularly, the remaining portion of the sacrificial gate sidewall spacer 249, which is positioned laterally immediately adjacent to the gate 260 and which is below and immediately adjacent to the first segment 270a of the air-gap gate sidewall spacer 270 (not shown).

In any case, the dielectric spacer layer deposited at process 108 to form the air-gap gate sidewall spacer 270 can be made of a dielectric material, which is different from the material of the gate cap 263, the material of the plug caps 249 and the material of the layer 252 of ILD. Optionally, the dielectric material of the dielectric spacer layer can be the same as the sacrificial gate sidewall spacer material. Thus, for example, if the gate cap material is silicon oxycarbonitiride (SiOCN), the sacrificial gate sidewall spacer material is silicon nitride (SiN), the plug cap material is hafnium oxide and the ILD material of the layer 252 is silicon dioxide, then the dielectric spacer layer material for the air-gap gate sidewall spacer 270 can be silicon boron carbonitride (SiBCN) or silicon nitride (SiN). Alternatively, if the gate cap material is silicon nitride (SiN), the sacrificial gate sidewall spacer material is silicon boron carbonitride (SiBCN), the plug cap material is hafnium oxide and the ILD material of the layer 252 is silicon dioxide, then the dielectric spacer layer material for the air-gap gate sidewall spacer 270 can be silicon oxycarbide (SiCO). Alternatively, if the gate cap material is silicon boron carbonitride (SiBCN), the sacrificial gate sidewall spacer material is silicon nitride (SiN), the plug cap material is hafnium oxide and the ILD material of the layer 252 is silicon dioxide, then the dielectric spacer layer material for the air-gap gate sidewall spacer 270 can be silicon oxycarbide (SiCO). Alternatively, if the gate cap material is amorphous silicon (a-Si), the sacrificial gate sidewall spacer material is silicon nitride (SiN), the plug cap material is hafnium oxide and the ILD material of the layer 252 is silicon dioxide, then the dielectric spacer layer material for the air-gap gate sidewall spacer 270 can be silicon oxycarbide (SiCO) or silicon oxycarbonitiride (SiOCN).

Next, any of the dielectric spacer layer material above the top surfaces of the layer 252 of ILD material, the plug caps 249 and the gate cap 263 of each FET 201-202 can be removed. This can be accomplished, for example, using a polishing process (e.g., a chemical mechanical polishing (CMP) process). In this case, as illustrated in FIG. 5B, the height of the top surfaces of at least the layer 252 of ILD material and the plug caps 249 will be reduced such that top surface of the resulting partially completed structure is essentially planar (i.e., such that the top surfaces of the layer 252 of ILD material, of each plug cap 249, of each air-gap gate sidewall spacer 270 and of each gate cap 263 are essentially co-planar). Alternatively, this can be accomplished by selectively recessing the dielectric spacer layer. In this case, as illustrated in FIG. 5C, the top surface of each air-gap gate sidewall spacer 270 will be at or below the level of the top surface of each gate cap 263 and the top surface of each gate cap 263 may be at or below the level of the top surfaces of the plug caps 249 and layer 252 of ILD material (e.g., in the case where selective isotropic etching of the gate cap is performed at process 106, discussed above).

It should be noted that, if the gate cap 263 was a sacrificial gate cap (i.e., if it was made with a sacrificial material, such as amorphous silicon (a-Si) or amorphous carbon (a-C), then prior to any additional processing, the sacrificial gate cap would need to be selectively removed and replaced with a replacement gate cap. The replacement gate cap (not shown) could be made, for example, of a different dielectric material than that used for the dielectric spacer layer material of the air-gap gate sidewall spacer 270, for the layer 252 of ILD material and for the plug caps 249.

For purposes of illustration, the remaining process steps in the method are described below and illustrated in the figures with respect to the partially completed structure shown in FIG. 5B. However, it should be understood that the figures are not intended to be limiting and that, alternatively, the remaining process steps could be performed with respect to the partially completed structure shown in FIG. 5C.

Figure 6:
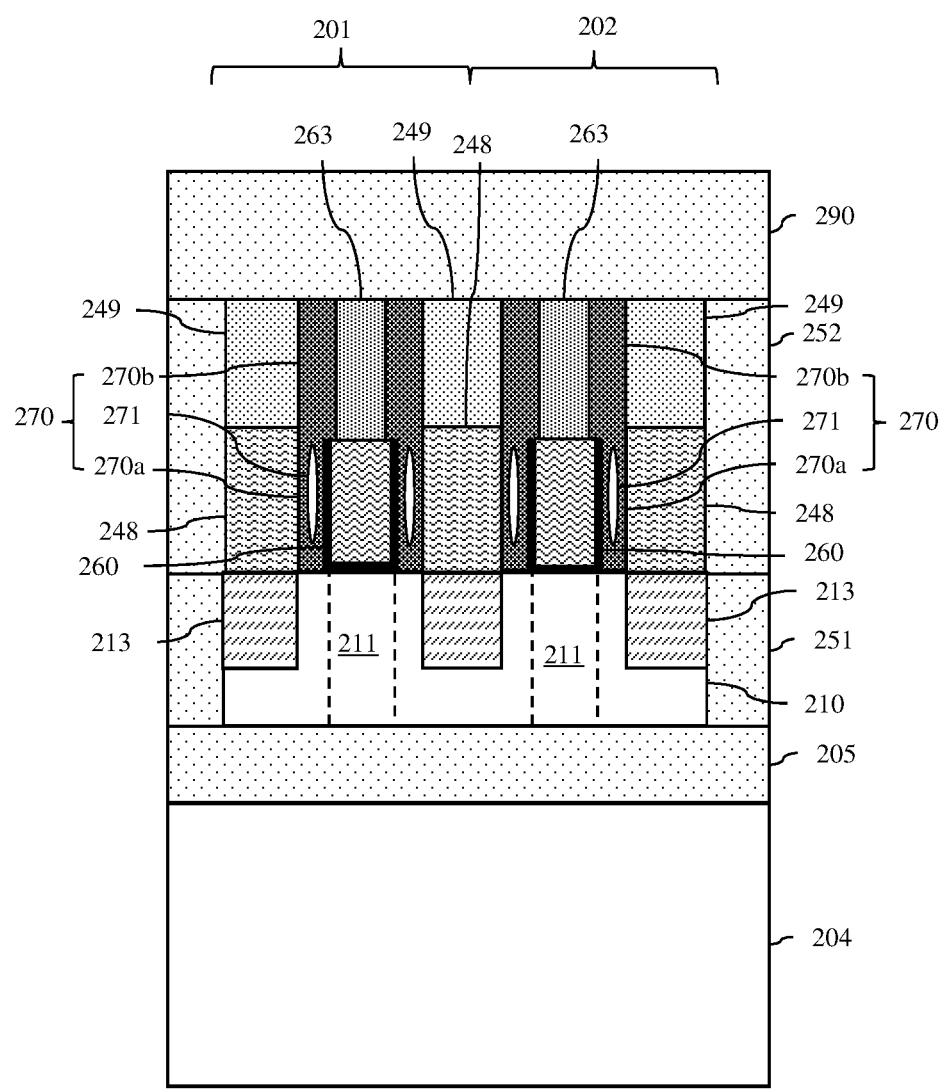
FIG. 6 is a cross section diagram illustrating a partially completed structure formed according to the flow diagram of FIG. 1.

Next, a blanket layer 290 of ILD material can be deposited over the layer 252 of ILD material and over each FET 201-202 and, particularly, over the plug caps 249, the air-gap gate sidewall spacer 270 and the gate cap 263 of each FET 201-202 (see process 110 and FIG. 6). The ILD material of this blanket layer 290 can, for example, be the same ILD material as that used for the layer 252 (e.g., see discussion above).

Subsequently, middle of the line (MOL) contacts can be formed, which extend vertically through the layer 290 of ILD material down to the metal plugs 248 and gate 260 of each FET (see process 112). Various different processing techniques are known in the art and could be performed at process 112. In an exemplary embodiment of the method, the following steps take advantage of the different materials used for the layers 290, 252 of ILD material and for the plug caps 249, the air-gap gate sidewall spacer 270 and the gate cap 263 of each FET 201-202 in order to form self-aligned MOL contacts for each FET 201-202 (i.e., self-aligned source/drain contacts and a self-aligned gate contact for each FET 201-202) for added robustness.

It should be noted that because of space constraints and critical dimensions, typically, a gate contact to a gate of a given FET and the source/drain contacts to metal plugs of that same FET will not be perfectly aligned along the length of the FET (i.e., along cross-section Z-Z' shown in the figures). Thus, the figures only show the formation of two contact openings and the formation of the corresponding contacts in those contact openings in an area along the length of the FETs. Specifically, as described in greater detail below, FIGS. 7-13 show formation of a source/drain contact opening 293 to one of the metal plugs of the second FET 202, formation of a gate contact opening 293 to the gate 260 of the first FET 201, and formation of contacts 294 and 295 in these contact openings 291 and 293, respectively. However, it should be understood other MOL contacts to each of the FETs 201-202 (including the source/drain contacts to the first FET 201 and another source/drain contact and a gate contact to the second FET 202) would be concurrently formed at process 112 outside the cross-section Z-Z' shown.

Figure 7:
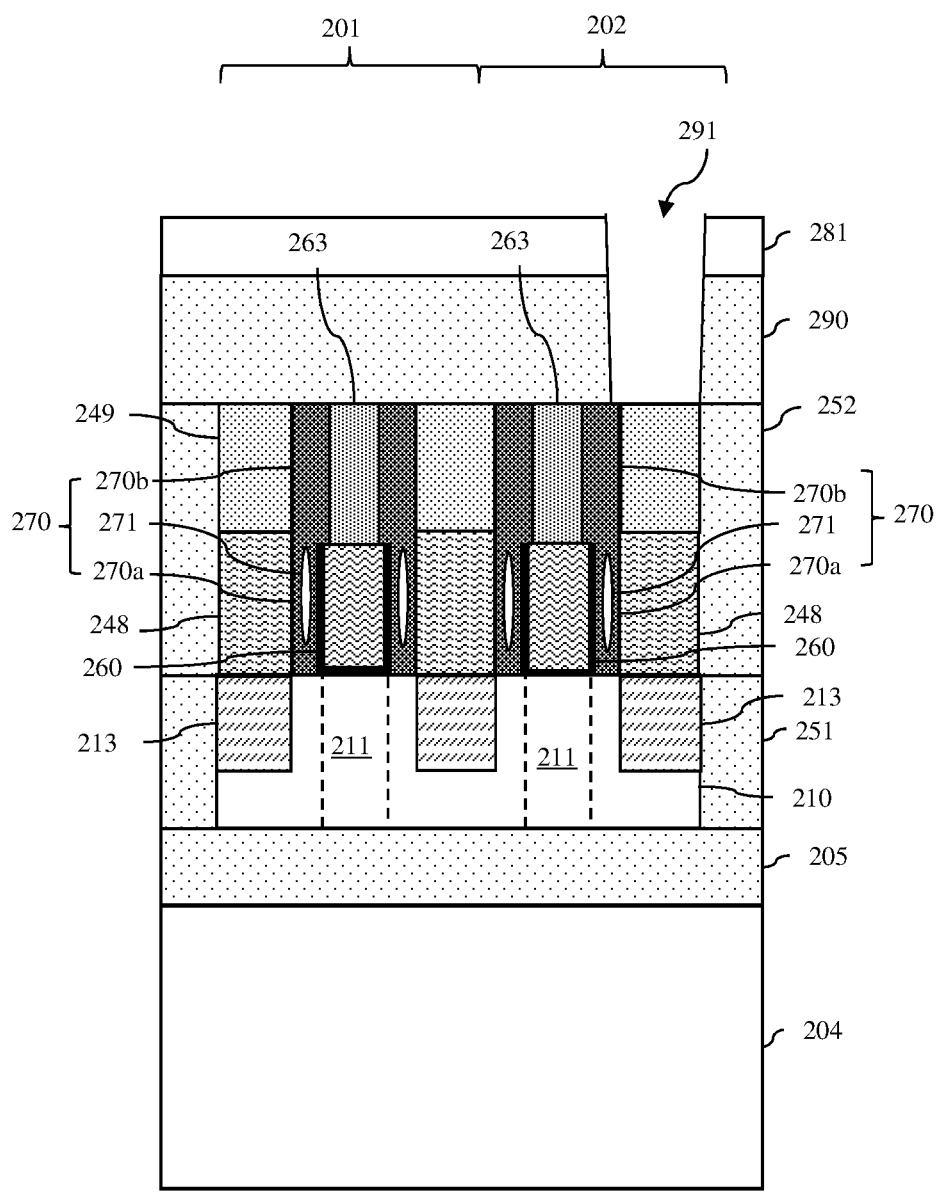
FIG. 7 is a cross section diagram illustrating a partially completed structure formed according to the flow diagram of FIG. 1.
Figure 8:
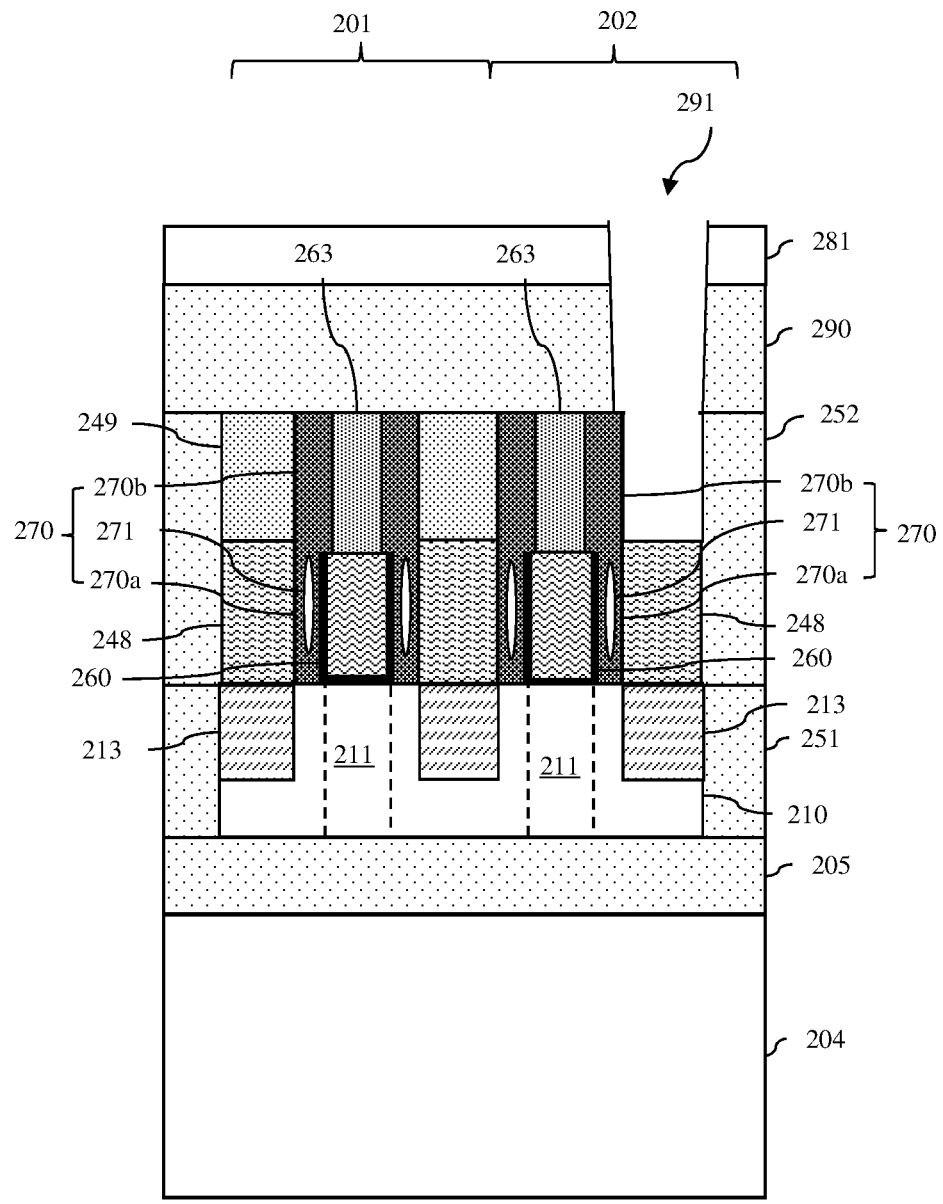
FIG. 8 is a cross section diagram illustrating a partially completed structure formed according to the flow diagram of FIG. 1.

Specifically, at process 112, a first mask layer 281 (e.g., a first optical polymerization layer (OPL)) can be formed over the layer 290 of ILD material (see process 121 and FIG. 7). The first mask layer 281 can be lithographically patterned with source/drain contact openings 291, which extend vertically through the first mask layer 281 to the layer 290 and which are aligned above the plug caps 249 of each of the FETs 201-202 (see process 122 and FIG. 7). Next, the source/drain contact openings 291 can be extended through the layer 290 to the plug caps 249 using an anisotropic etch process that is selective for the ILD material of the layer 290 (see FIG. 7) and further extended through the plug caps 249 to metal plugs 248 below using a different selective anisotropic etch process (see process 123 and FIG. 8). Since the material of the plug caps 249 is different from the material of the gate cap 263, the material of the layer 251 of ILD material, and the material of the air-gap gate sidewall spacer 270, the process of further extending the source/drain contact openings 291 to the metal plugs 248 can be a selective anisotropic etch process that is specifically selective for the material of the plug caps 249 over the gate cap, ILD and dielectric spacer layer materials. The first mask layer 281 can then be selectively removed (see process 124).

Figure 9A:
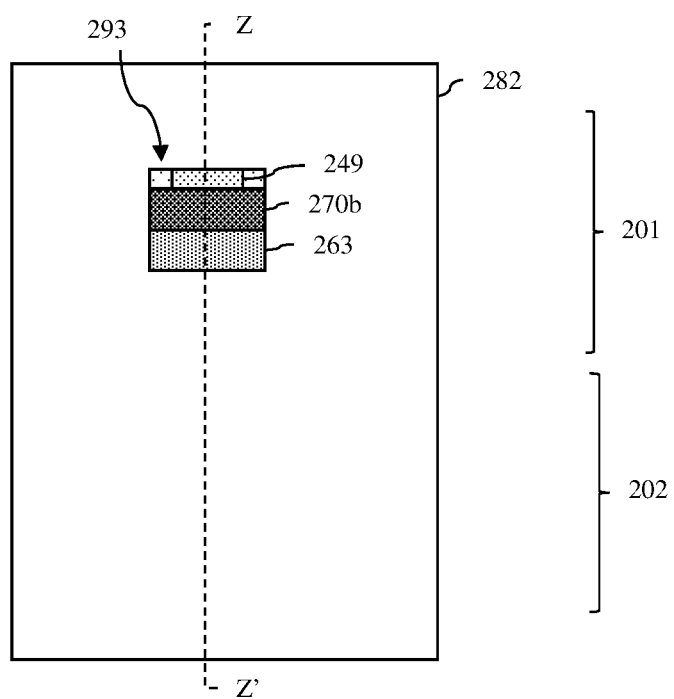
FIGS. 9A and 9B are a top view diagram and a cross section diagram illustrating a partially completed structure formed according to the flow diagram of FIG. 1.
Figure 9B:
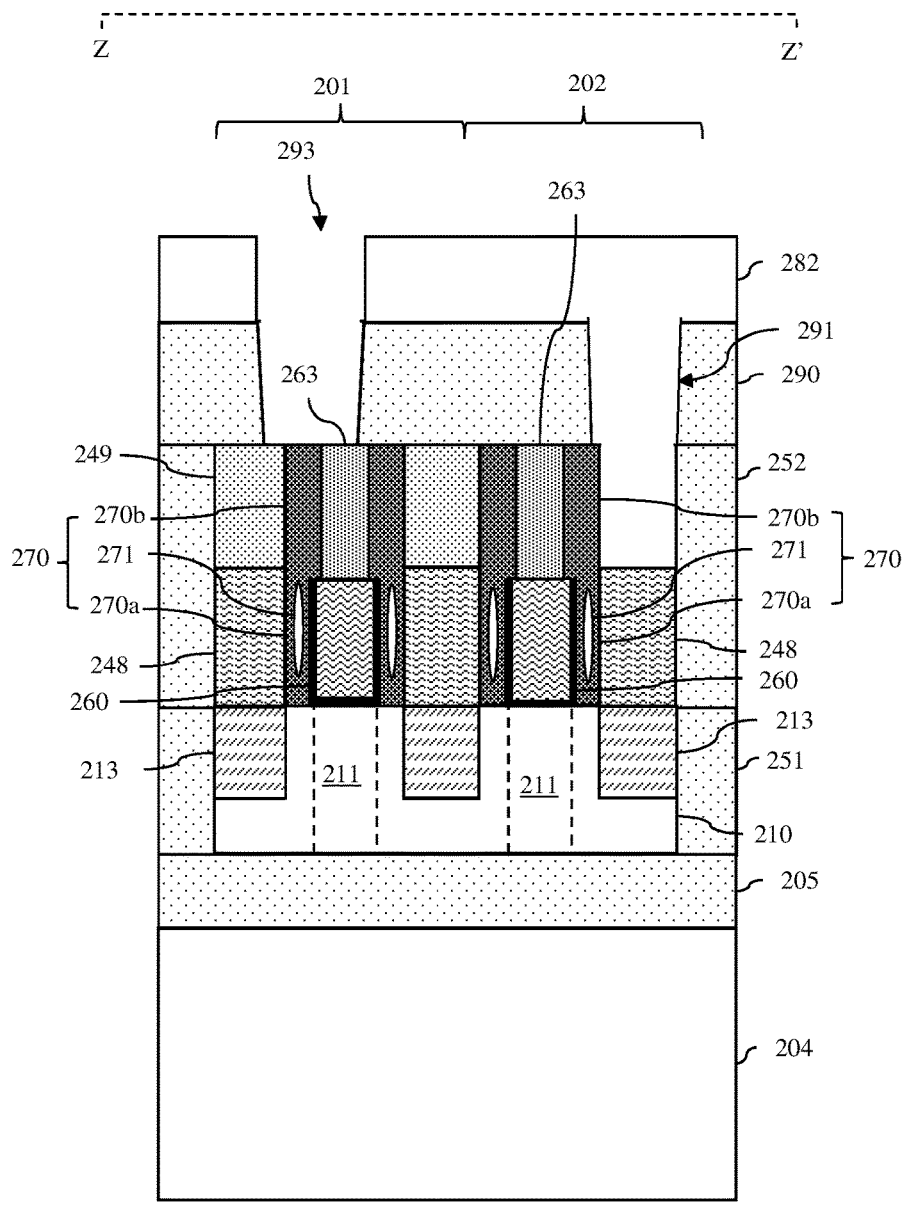

A second mask layer 282 (e.g., a second OPL) can be formed on the layer 290 of ILD material (see process 125 and FIGS. 9A-9B). This second mask layer 282 can be lithographically patterned with at least one gate contact opening 293 to each gate of each FET 201-202 being formed according to the method (see process 126 and FIGS. 9A-9B). Specifically, the gate contact opening(s) 293 can extend vertically through the second mask layer 282 to the layer 290 of ILD material and can be aligned above the gate(s) 260. Multiple selective etch processes can then be performed to extend the gate contact opening(s) 293 through the layer 290 of ILD material and through the gate cap(s) 263 to the gate(s) 260 below. Specifically, a selective anisotropic etch process can be performed to extend the gate contact opening(s) 293 through the layer 290 of ILD material, stopping on the different materials of the gate cap 263, of the air-gap gate sidewall spacer 270 and, optionally and depending upon the size and positioning of the gate contact opening(s), of one or more of adjacent plug caps 249 and the layer 252 of ILD material (see process 127 and FIGS. 9A-9B). Another selective anisotropic etch process can be performed to further extend the gate contact opening(s) 293 through the gate cap(s) 263 to the gate(s) 260 below (see FIGS. 10A-10B). Since the material of the gate cap(s) 263 is different from the material of the plug caps 249, the ILD material of the layer 251, and the dielectric spacer layer material of the air-gap gate sidewall spacer(s) 270 adjacent to the gate(s) 260, the process of further extending the gate contact opening(s) 293 to the gate(s) 260 can be a selective anisotropic etch process that is specifically selective to the gate cap material over the plug cap, ILD and dielectric spacer layer materials. The second mask layer 282 can then be selectively removed (see process 128).

For purposes of illustration, the gate contact opening(s) 293 are described above as being performed after the formation of the source/drain contact openings 291. However, it should be understand that the above-described process steps are exemplary in nature and not intended to be limiting. Thus, it should also be understood that, alternatively, similar process steps could be performed in a different order so as to form the gate contact opening(s) 293 prior to formation of the source/drain contact openings 291.

In any case, source/drain contacts 294 and gate contact(s) 295 can subsequently be formed in the source/drain contact openings 291 and the gate contact opening(s) 293, respectively (see process 129 and FIGS. 11-13). Various different techniques for forming MOL contacts in contacts openings are well known in the art and, thus, the details of forming these contacts have been omitted from this specification in order to allow the reader to focus on the salient aspects of the disclosed methods. Generally, these techniques include optionally lining the contact openings with a liner that incorporates one or more adhesion and/or barrier layers (e.g., titanium, titanium nitride, etc.), filling the contact openings with a metal (e.g., copper, tungsten, aluminum, cobalt, or any other metal material that is suitable for MOL contact formation) and performing a polishing process (e.g., a CMP process) to remove the metal from above the top surface of the layer 290 of ILD material.

Figure 10A:
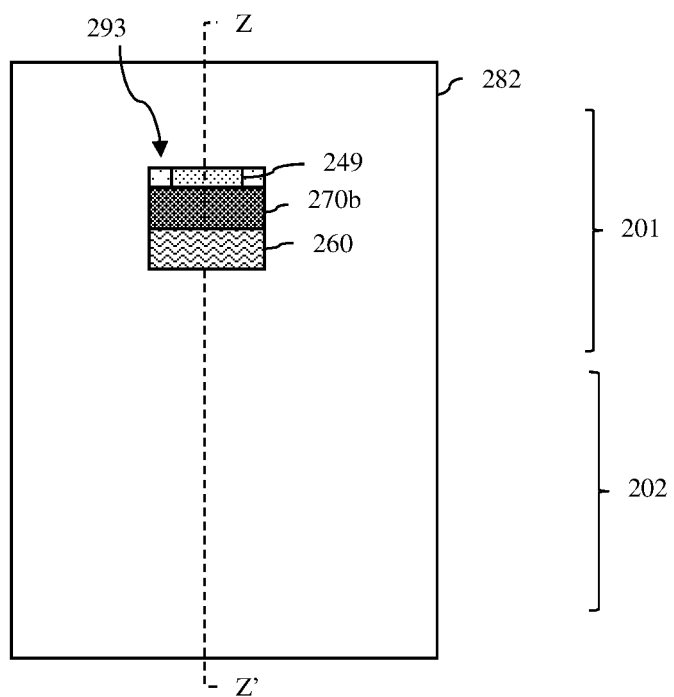
FIGS. 10A and 10B are a top view diagram and a cross section diagram illustrating a partially completed structure formed according to the flow diagram of FIG. 1.
Figure 10B:
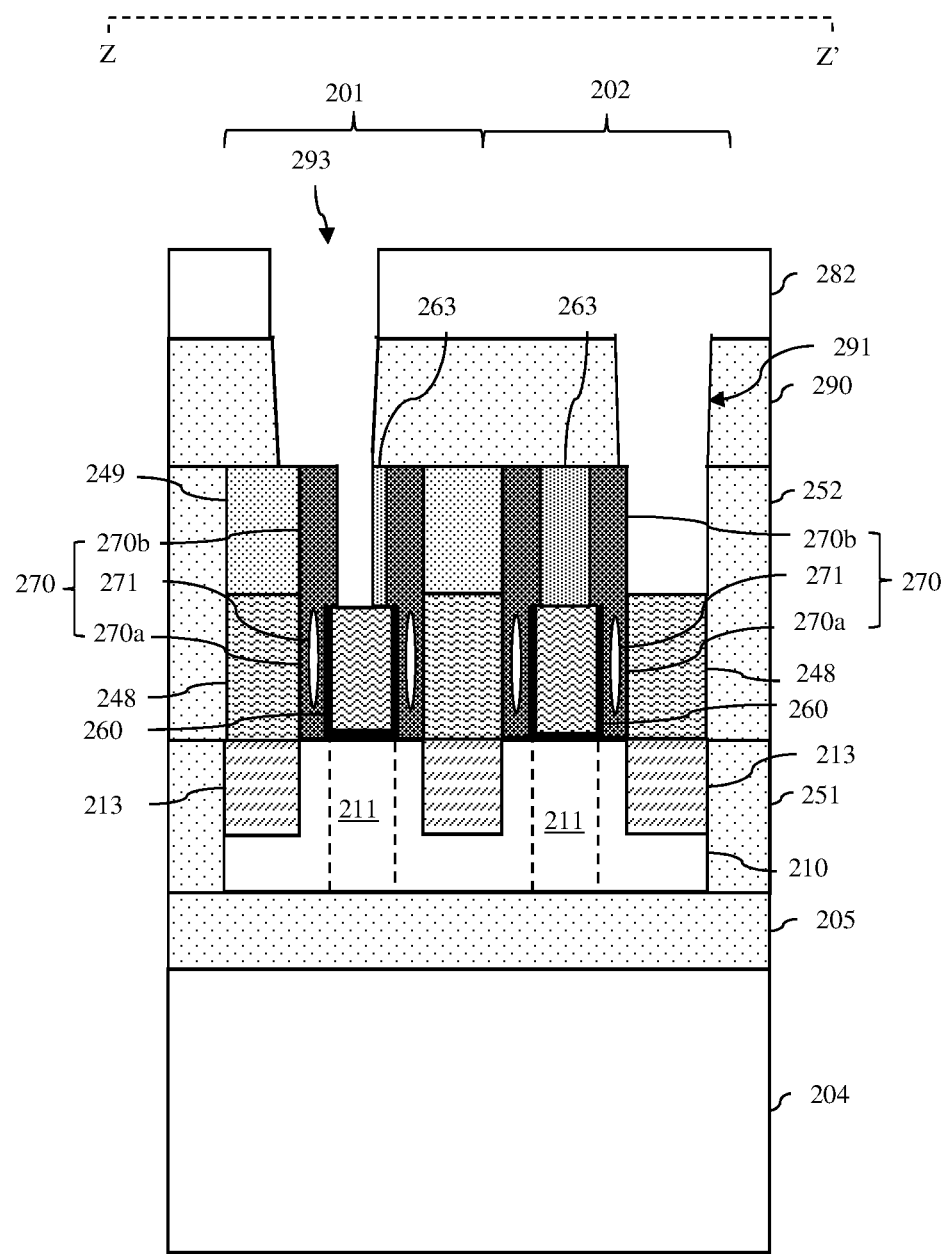

By providing a technique wherein the plug caps 249 can be selectively etched over the adjacent dielectric materials, the resulting source/drain contact openings 291 and, thereby the source/drain contacts 294 contained there are considered self-aligned to the metal plugs 248. Thus, the disclosed method ensures that, during source/drain contact opening formation, adjacent gate(s) 260 will remain protected by the air-gap gate sidewall spacer 270 and gate cap 263 (i.e., will remain unexposed), thereby minimizing or avoiding all together the risk of source/drain contact-to-gate shorts. Similarly, by providing a technique wherein the gate cap(s) 263 can be selectively etched over the adjacent dielectric materials, the resulting gate contact opening(s) 293 and thereby the gate contact(s) 295 contained therein are considered self-aligned to the gate(s) 260. Thus, the disclosed method also ensures that, during gate contact opening formation, any adjacent metal plugs 248 will remain protected by the air-gap gate sidewall spacer 270 and plug caps 249 (i.e., will remain unexposed), thereby minimizing or avoiding all together the risk of gate contact-to-metal plug shorts. As a result, a gate contact opening 293 can be patterned so that it lands on a gate over an active region (i.e., a CBoA), for example, above the channel region(s) 211 as illustrated in FIG. 10B, or close thereto, without risking a short with an adjacent metal plug 248 when the gate contact is subsequently formed within that gate contact opening 293. Furthermore, since the air-gap 271 in the air-gap gate sidewall spacer 270 is contained within the first segment 270a (i.e., the lower segment), since the second segment 270b (i.e., the upper segment) is a solid segment made of a dielectric spacer layer and since the material of this dielectric spacer layer is not etched away during formation of the gate contact opening(s) 293 or the source/drain contact openings 291, the air-gap 271 will not be breached. As a result, the risk that metal, which is deposited during formation of the gate contact(s) and source/drain contacts, will enter the air-gap 271 causing a gate-to-metal plug short is also minimized or avoided all together. Consequently, the air-gap gate sidewall spacer 270 will minimize parasitic gate-to-metal plug capacitance, as intended.

Figure 11:
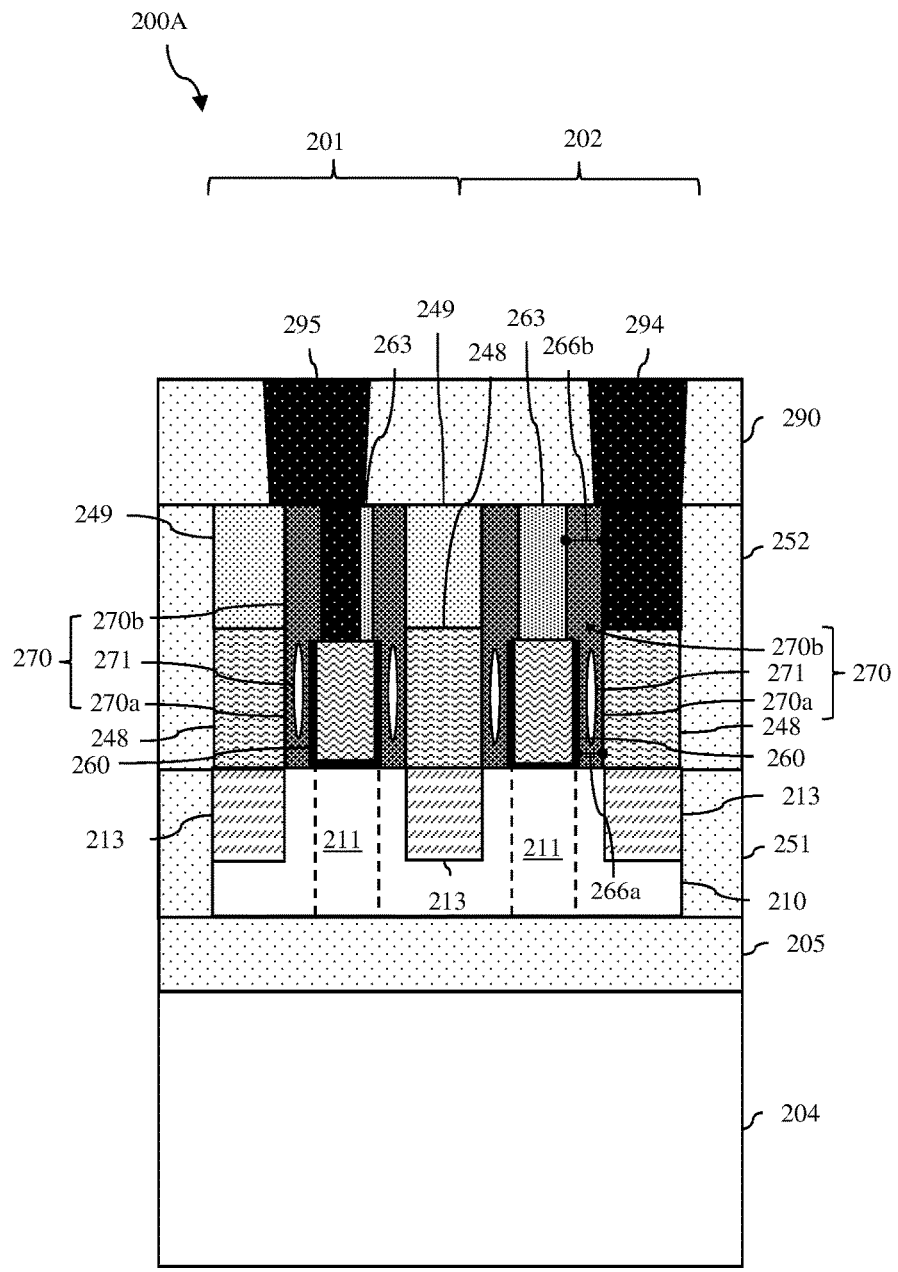
FIG. 11 is a cross section diagram illustrating a partially completed structure formed according to the flow diagram of FIG. 1.
Figure 12:
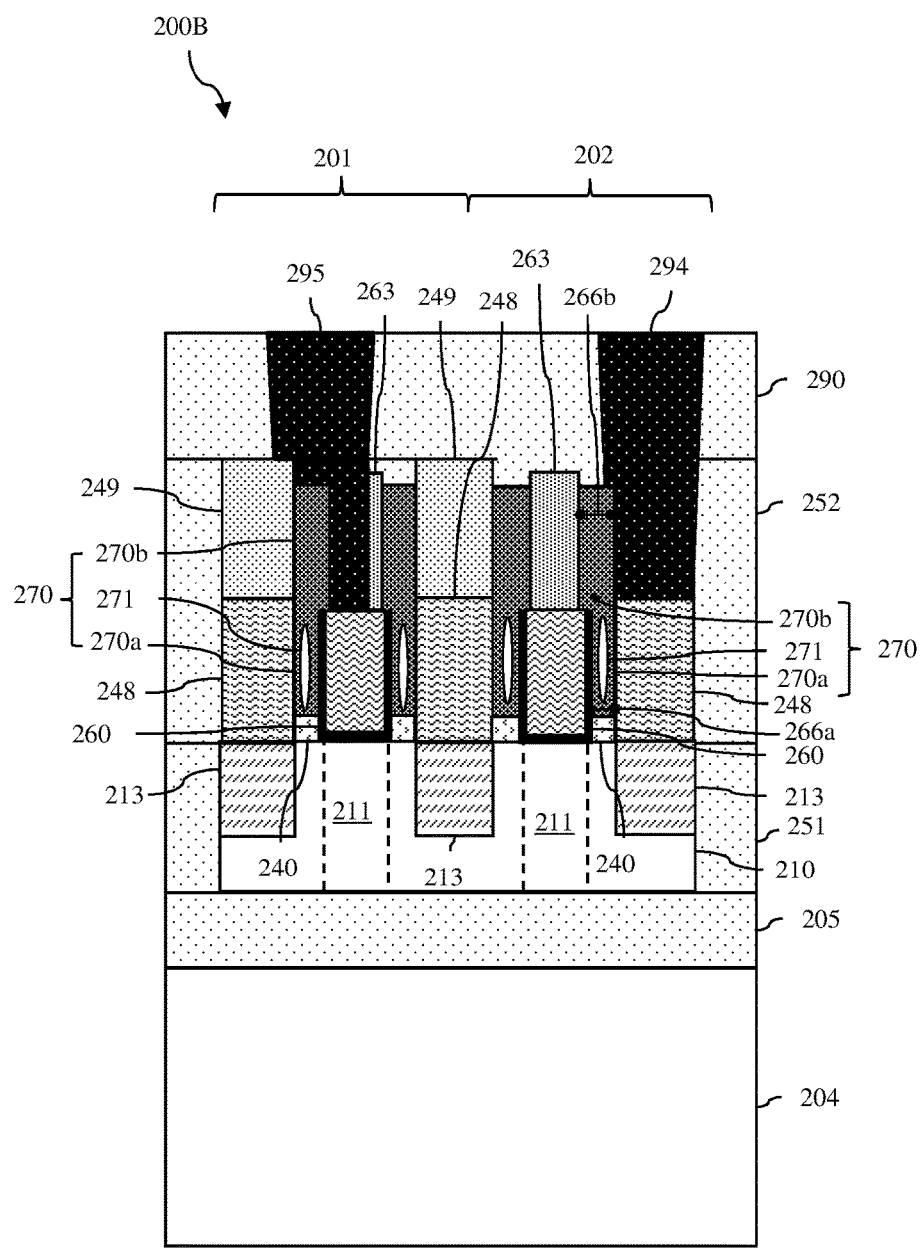
FIG. 12 is a cross section diagram illustrating a partially completed structure formed according to the flow diagram of FIG. 1.
Figure 13:
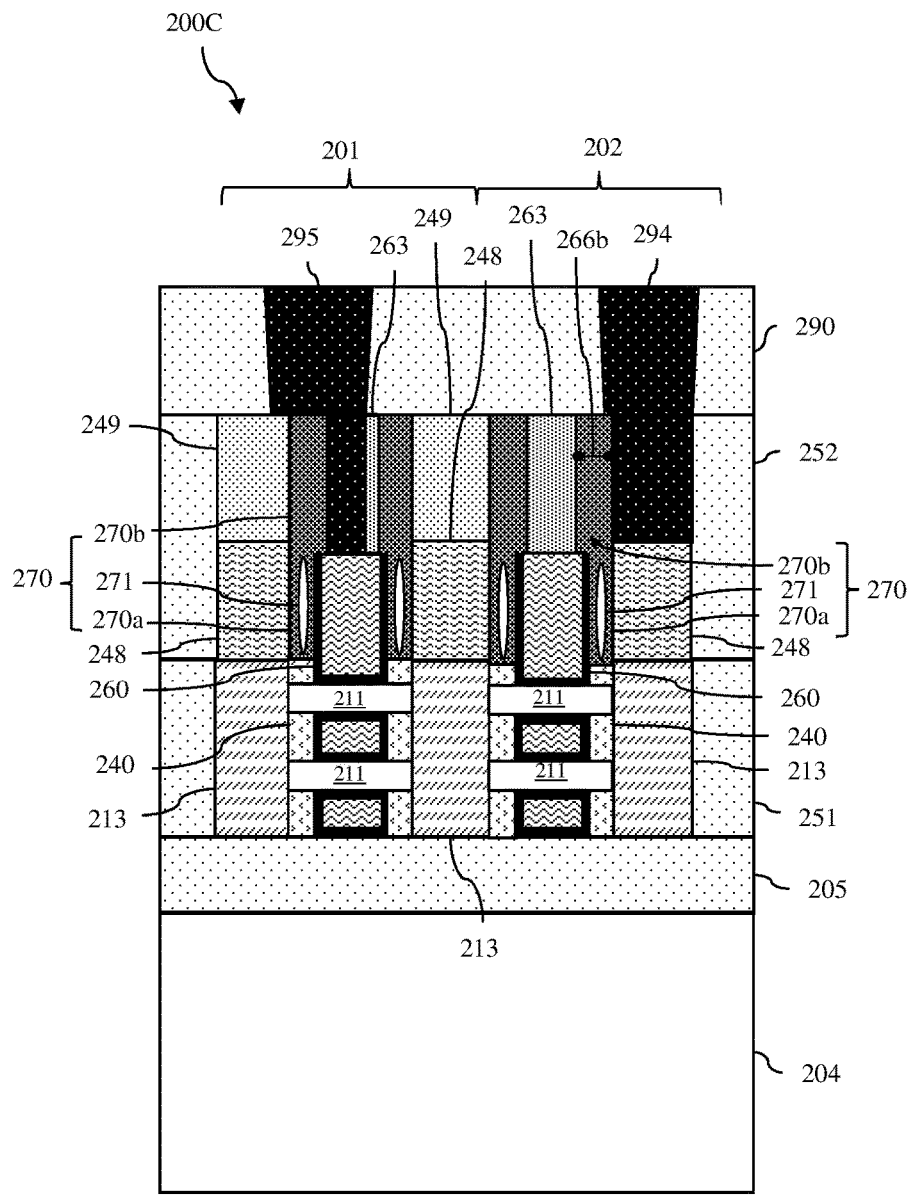
FIG. 13 is a cross section diagram illustrating an integrated circuit (IC) structure formed according to the flow diagram of FIG. 1.

Referring to FIGS. 11, 12 and 13, also disclosed herein are various embodiments 200A, 200B, 200C, respectively, of an integrated circuit (IC) structure formed according to the above-described method embodiments.

Each of the embodiments 200A-200C can be formed, as described in detail above, on a semiconductor wafer. The semiconductor wafer can be a semiconductor-on-insulator wafer (e.g., a silicon-on-insulator (SOI)) wafer that includes a semiconductor substrate 204 (e.g., a silicon substrate), an insulator layer 205 (e.g., a buried oxide (BOX) layer or other suitable insulator layer on the semiconductor substrate) and a semiconductor layer (e.g., a silicon layer or other suitable semiconductor layer) on the insulator layer 205. Alternatively, the semiconductor wafer can be a bulk semiconductor wafer (e.g., a bulk silicon wafer or other suitable bulk semiconductor wafer).

Each of the embodiments 200A-200C can include one or more field effect transistors (FETs) (e.g., see FETs 201-202) on a substrate (e.g., above the insulator layer 205 of an SOI wafer), laterally surrounded by one or more layers (e.g., see layers 251-252) of interlayer dielectric (ILD) material and covered by another layer 290 of ILD material. The IC structure can include, for example, at least two non-planar FETs 201-202 that share a source/drain region (e.g., see the embodiments 200A-200C in FIGS. 11-13). The IC structure can include, for example, two fin-type FETs (FINFETs) that share a source/drain region (e.g., see the embodiments 200A-200B in FIGS. 11-12). The IC structure can include, for example, two nanowire (NW)-type FETs (NWFETs) that share a source/drain region (e.g., see the embodiment 200C in FIG. 11). It should be understood that the embodiments described herein and illustrated in the Figures are not intended to be limiting and that, alternatively, the IC structure could include any number of one or more FETs, which are non-planar or planar FETs and which may or may not share a source/drain region.

As mentioned above, a FINFET (e.g., such as each of the FINFETs shown in FIGS. 11 and 12) is a non-planar FET that incorporates a semiconductor fin 210 (i.e., a relatively tall and thin, elongated, rectangular-shaped, semiconductor body) and, within the semiconductor fin, a channel region that is positioned laterally between source/drain regions. A gate 260, which includes a conformal gate dielectric layer and a gate conductor layer on the gate dielectric layer, is positioned adjacent to the top surface and opposing sidewalls of the semiconductor fin 210 at the channel region. Also, as mentioned above, a NWFET (e.g., such as each of the NWFETs shown in FIG. 13) is also a non-planar FET. In an NWFET, one or more NW channel region(s) extend laterally between source/drain regions. In this case, a gate 260 (e.g., a gate-all-around gate structure), which includes a conformal gate dielectric layer and a gate conductor layer, wraps around each of the NW channel region(s).

In any case, each FET 201-202 can include source/drain regions 213 and one or more channel regions 211 positioned laterally between the source/drain regions 213. The FETs 201-202 can, for example, be P-type FETs (PFETs), wherein the source/drain regions 213 re doped so as to have P-type conductivity at a relatively high conductivity level (e.g., P+ conductivity) and the channel region(s) 211 are either undoped or doped so as to have N-type conductivity at a relatively low conductivity level (e.g., N− conductivity). Alternatively, the FETs 201-202 can be N-type FETs (NFETs), wherein the source/drain regions 213 are doped so as to have N-type conductivity at a relatively high conductivity level (e.g., N+ conductivity) and the channel region(s) 211 are either undoped or doped so as to have P-type conductivity at a relatively low conductivity level (e.g., P− conductivity).

Those skilled in the art will recognize that different dopants can be used to achieve the different conductivity types and that the dopants may vary depending upon the different semiconductor materials used. For example, a silicon-based semiconductor material having N-type conductivity is typically doped with a Group V dopant, such as arsenic (As), phosphorous (P) or antimony (Sb), whereas a silicon-based semiconductor material having P-type conductivity is typically doped with a Group III dopant, such as boron (B) or indium (In). Alternatively, a gallium nitride (GaN)-based semiconductor material having P-type conductivity is typically doped with magnesium (Mg), whereas a gallium nitride (GaN)-based semiconductor material having an N-type conductivity is typically doped with silicon (Si). Those skilled in the art will also recognize that different conductivity levels will depend upon the relative concentration levels of the dopants.

Each FET 201-202 can further include a gate 260 adjacent to the channel region(s) 211 and having a gate cap 263 and an air-gap gate sidewall spacer 270. In the case of the FINFETs shown in FIGS. 11-12, each gate 260 can be positioned adjacent to the top surface and opposing sidewalls of a semiconductor fin at a channel region 211. In the case of the NWFETs shown in FIG. 13, each gate 260 can be a gate-all-around gate structure that wraps around each the channel region(s) 211.

In any case, the gate 260 can be a gate-first gate structure that includes a conformal gate dielectric layer (e.g., a silicon dioxide layer) and a gate conductor layer (e.g., a polysilicon gate conductor layer) on the gate dielectric layer. Those skilled in the art will recognize that, for a PFET, the polysilicon gate conductor layer will typically be doped so as to have P-type conductivity; whereas for an NFET, the polysilicon gate conductor layer will typically be doped so as to have N-type conductivity. Alternatively, the gate 260 can be a replacement metal gate (RMG). A RMG can include a conformal gate dielectric layer and a metal gate conductor layer on the gate dielectric layer. The materials and thicknesses of these layers can be preselected to achieve desired work functions given the conductivity type of the FET. The conformal gate dielectric layer can be a high-K dielectric material or, more particularly, a dielectric material with a dielectric constant that is greater than the dielectric constant of silicon dioxide (i.e., greater than 3.9). Exemplary high-K dielectric materials include, but are not limited to, hafnium (Hf)-based dielectrics (e.g., hafnium oxide, hafnium silicon oxide, hafnium silicon oxynitride, hafnium aluminum oxide, etc.) or other suitable high-k dielectrics (e.g., aluminum oxide, tantalum oxide, zirconium oxide, etc.). The metal gate conductor layer can include, for example, a work function metal layer and conductive fill material on the work function metal layer. The work function metal layer can be a layer of a metal material or a metal alloy material that is preselected in order to achieve the optimal gate conductor work function given the conductivity type of the FET. For example, the optimal gate conductor work function of an NFET will be, for example, between 3.9 eV and about 4.2 eV. Exemplary metals (and metal alloys) having a work function within this range include, but are not limited to, hafnium, zirconium, titanium, tantalum, aluminum, and alloys thereof, such as, hafnium carbide, zirconium carbide, titanium carbide, tantalum carbide, and aluminum carbide. The optimal gate conductor work function for a PFET will be, for example, between about 4.9 eV and about 5.2 eV. Exemplary metals (and metal alloys) having a work function within this range include, but are not limited to, ruthenium, palladium, platinum, cobalt, and nickel, as well as metal oxides (aluminum carbon oxide, aluminum titanium carbon oxide, etc.) and metal nitrides (e.g., titanium nitride, titanium silicon nitride, tantalum silicon nitride, titanium aluminum nitride, tantalum aluminum nitride, etc.). The conductive fill material can be an additional layer of a metal or a metal alloy, such as tungsten, a tungsten alloy (e.g., tungsten silicide or titanium tungsten), cobalt, aluminum or any other suitable metal or metal alloy.

The gate cap 263 can be on the top surface of the gate 260. Optionally, as discussed in greater detail with regard to the method embodiments and as illustrated in the embodiments 200A-200C in FIGS. 11-13, the gate cap 260 can be narrower in width than the gate 260 below.

The air-gap gate sidewall spacer 270 can be positioned immediately adjacent to and can laterally surround the sidewalls of the gate 260 and the gate cap 263. The air-gap gate sidewall spacer 270 can include a first segment 270a (i.e., a lower segment) positioned laterally immediately adjacent to the gate 260 and a second segment 270*b* (i.e., an upper segment) above the first segment 270*a*. The first segment 270*a* can include an air-gap 271 and, optionally, some dielectric spacer material. The second segment 270*b* can include a dielectric spacer layer, which traps the air-gap 271 within the first segment 270*a*. Optionally, the air-gap gate sidewall spacer 270 can include an additional segment below the first segment 270*a* and positioned laterally adjacent to the gate 260 (e.g., see the embodiments 200B and 200C of FIGS. 12-13). This additional segment can be a remaining portion of a sacrificial gate sidewall spacer 240, which was formed and then subsequently etch away during processing. As mentioned above, optionally, the gate cap 263 can be narrower than the gate 260 below. In this case, the first segment 270*a* of the air-gap gate sidewall spacer 270 will have a first width 266*a* and the second segment 270*b* will have the second width 266*b* that is wider than the first width such that the second segment 270*b* extends laterally onto the top surface of the gate 260 and covers the upper corners of the gate 260.

Each FET 201-202 can further include metal plugs 248 on the source/drain regions 213 and plug caps 249 on the metal plugs 248. Specifically, the metal plugs 248 can be above and in contact with the top surfaces of the source/drain regions 213. The metal plugs 248 can be made of a metal or metal alloy (e.g., a tungsten, cobalt, aluminum or any other suitable metal plug material). Plug caps 249 can be above and in contact with the top surfaces of the metal plugs 248. As illustrated, the first segment 270*a* of the air-gap gate sidewall spacer 270 is positioned laterally between the metal plugs 248 and the gate 260 and the second segment 270*b* of the air-gap gate sidewall spacer 270 can be positioned laterally between the plug caps 249 and the gate cap 263 (or a gate contact, as discussed below).

It should be noted that, depending upon the technique used to form the air-gap gate sidewall spacer 270 (see the detailed discussion of process 108 above), the top surfaces of the layer 252 of ILD material, of each plug cap 249, of each air-gap gate sidewall spacer 270 and of each gate cap 263 can be essentially co-planar (e.g., see the embodiments 200A and 200C of FIGS. 11 and 13, respectively). Alternatively, the top surface of each air-gap gate sidewall spacer 270 will be at or below the level of the top surface of each gate cap 263 and the top surface of each gate cap 263 may be at or below the level of the top surfaces of the plug caps 249 and the layer 252 of ILD material (e.g., see the embodiment 200B of FIG. 12).

Each of the FETs 201-202 can further include middle of the line (MOL) contacts including source/drain contacts 294 that extend through the layer 290 of ILD material and the plug caps 249 to the metal plugs 248 and at least one gate contact 295 that extends through the layer 290 of ILD material and the gate cap 263 to the gate 260. As mentioned above with regard to the method embodiments, because of space constraints and critical dimensions, typically, a gate contact to a gate of a given FET and the source/drain contacts to metal plugs of that same FET will not be perfectly aligned along the length of the FET (i.e., along cross-section Z-Z' shown in the figures). Thus, the figures only show the two contacts in an area along the length of the FETs 201, and 202. Specifically, the figures show a gate contact 295 landing on the gate 260 of the first FET 201 above the channel region 211 and a source/drain contact 294 of the second FET 202. However, it should be understood that the FETs will include other MOL contacts (e.g., the source/drain contacts of the first FET 201 and another source/drain contact and a gate contact of the second FET 202) outside the cross-section Z-Z' shown.

In each of the FETs 201-202 of the embodiments 200A-200C, the gate cap 263, remaining portion of the sacrificial gate sidewall spacer 240 (if present), the plug caps 249, the ILD material and the dielectric spacer layer of the air-gap gate sidewall spacer 270 can be made of different dielectric materials. That is, the gate cap 263 can be made of a first dielectric material. The remaining portion of the sacrificial gate sidewall spacer 240 can be made of a second dielectric material that is different from the first dielectric material. The plug caps 249 can be made of a third dielectric material that is different from the first dielectric material and the second dielectric material. The ILD material can be a fourth dielectric material that is different from the first dielectric material, the second dielectric material and the third dielectric material. The dielectric spacer layer of the air-gap gate sidewall spacer can be made of a fifth dielectric material. The fifth dielectric material can be different from the first dielectric material, the third dielectric material and the fourth dielectric material and either the same or different than the second dielectric material. See a more detailed discussion of the possible combinations of different materials in the discussion of the method embodiments above.

In any case, incorporation of these various different materials into the IC structure ensures that the gate contact 295 and the source/drain contacts 294 are self-aligned to the gate 260 and metal plugs 248, respectively, thereby minimizing or avoiding all together the risk of gate contact-to-metal plug shorts and source/drain contact-to-gate shorts. Thus, the IC structure can include a gate contact 295 that actually lands on the gate 260 over an active region (i.e., a CBoA), for example, above the channel region(s) 211, as illustrated in FIG. 11-13, or close thereto. Additionally, by having a second segment 270*b* (i.e., the upper segment) of the air-gap gate sidewall spacer 270 above the first segment 270*a* (i.e., the lower segment), which contains the air-gap 271, and by ensuring that this second segment 270*b* is an essentially solid segment made of a dielectric material and, particularly, the fifth dielectric material that is not etched during the formation of the gate contact opening(s) 293 or the source/drain contact openings, the risk that the air-gap 271 will be breached is minimized or avoided all together. As a result, the risk that metal, which is used for the gate contact(s) 295 and source/drain contacts 294, will enter the air-gap 271 and cause a gate-to-metal plug short is also minimized or avoided all together. Consequently, the air-gap gate sidewall spacer 270 will minimize parasitic gate-to-metal plug capacitance, as intended.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
    forming a transistor comprising:
        source/drain regions;
        at least one channel region between the source/drain regions;
        a gate adjacent to the channel region and having a gate cap and a sacrificial gate sidewall spacer; and
        metal plugs on the source/drain regions, the sacrificial gate sidewall spacer being between the metal plugs and the gate and the metal plugs having plug caps;
    selectively etching the sacrificial gate sidewall spacer to create a cavity that exposes sidewalls of the gate and the gate cap;
    forming an air-gap gate sidewall spacer in the cavity by depositing a dielectric spacer layer such that an air-gap is formed in a first portion of the cavity adjacent to the gate and contained entirely below a level of a top of the gate and such that the dielectric spacer layer fills a second portion of the cavity adjacent to the gate cap and covers the air-gap;
    removing the dielectric spacer layer from above the plug caps and the gate cap;
    depositing interlayer dielectric material over the plug caps, the air-gap gate sidewall spacer and the gate cap; and
    forming a gate contact comprising:
        forming a gate contact opening that is aligned above the gate and that extends through the interlayer dielectric material to top surfaces of the gate cap and the air-gap gate sidewall spacer;
        extending the gate contact opening through the gate cap to the gate; and
        filling the gate contact opening with a conductor to form the gate contact.

2. The method of claim 1, the gate comprising a replacement metal gate.

3. The method of claim 1, the sacrificial gate sidewall spacer, the gate cap and the plug caps comprising different dielectric materials.

4. The method of claim 1, the gate cap, the plug caps and the dielectric spacer layer comprising different dielectric materials.

5. The method of claim 1, the gate contact opening being formed so as to land on a portion of the gate adjacent to an active region of the transistor.

6. The method of claim 1, the air-gap gate sidewall spacer being formed on a remaining portion of the sacrificial gate sidewall spacer.

7. A method comprising:
    forming a transistor comprising:
        source/drain regions;
        at least one channel region between the source/drain regions;
        a gate adjacent to the channel region and having a gate cap and a sacrificial gate sidewall spacer; and
        metal plugs on the source/drain regions, the sacrificial gate sidewall spacer being between the metal plugs and the gate and the metal plugs having plug caps;
    selectively etching the sacrificial gate sidewall spacer to create a cavity that exposes sidewalls of the gate and the gate cap; and
    etching back exposed sidewalls of the gate cap such that a first portion of the cavity adjacent to the gate has a first width and such that a second portion of the cavity adjacent to the gate cap has a second width that is greater than the first width; and
    forming an air-gap gate sidewall spacer in the cavity by depositing a dielectric spacer layer such that an air-gap is formed in the first portion of the cavity and such that the dielectric spacer layer fills the second portion.

8. The method of claim 7, the gate comprising a replacement metal gate.

9. The method of claim 7, the sacrificial gate sidewall spacer, the gate cap and the plug caps comprising different materials.

10. The method of claim 7, the gate cap, the plug caps and the dielectric spacer layer comprising different materials.

11. The method of claim 7, further comprising:
    removing the dielectric spacer layer from above the plug caps and the gate cap; depositing interlayer dielectric material over the plug caps, the air-gap gate sidewall spacer and the gate cap; and
    forming a gate contact comprising:
        forming a gate contact opening that is aligned above the gate and that extends through the interlayer dielectric material to top surfaces of the gate cap and the air-gap gate sidewall spacer;
        extending the gate contact opening through the gate cap to the gate; and
        filling the gate contact opening with a conductor to form the gate contact.

12. The method of claim 11, the gate contact opening being formed so as to land on the gate adjacent to an active region of the transistor.

13. The method of claim 7, the air-gap gate sidewall spacer being formed on a remaining portion of the sacrificial gate sidewall spacer.

* * * * *